United States Patent [19]
Toda

[11] Patent Number: 6,084,817
[45] Date of Patent: Jul. 4, 2000

[54] SEMICONDUCTOR MEMORY WITH TRANSFER BUFFER STRUCTURE

[75] Inventor: Haruki Toda, Yokohama, Japan

[73] Assignee: Kabushiki Kaisha Toshiba, Kawasaki, Japan

[21] Appl. No.: 09/264,928

[22] Filed: Mar. 9, 1999

Related U.S. Application Data

[63] Continuation of application No. 08/814,979, Mar. 11, 1997, Pat. No. 5,978,300.

[30] Foreign Application Priority Data

Mar. 11, 1996 [JP] Japan ..................................... 8-052811

[51] Int. Cl.[7] ...................................................... G11C 8/00
[52] U.S. Cl. .................... 365/230.03; 365/205; 365/207; 365/63
[58] Field of Search .......................... 365/230.03, 189.05, 365/205, 230.06, 207, 63

[56] References Cited

U.S. PATENT DOCUMENTS 5,367,495  11/1994  Ishikawa .
5,497,349   3/1996  Nakai et al. .
5,619,473   4/1997  Hotta ............................... 365/230.03 X
5,621,695   4/1997  Tran .................................... 365/230.03
5,671,188   9/1997  Patel et al. ............................... 365/205

FOREIGN PATENT DOCUMENTS

0401792A2  12/1990  European Pat. Off. .
0418747     3/1991  European Pat. Off. .
0678872    10/1995  European Pat. Off. .
0704847A1   4/1996  European Pat. Off. .
0771006     5/1997  European Pat. Off. .

Primary Examiner—Huan Hoang
Attorney, Agent, or Firm—Loeb & Loeb, LLP

[57] ABSTRACT

A plurality of sense amplifiers are provided between a plurality of memory cell arrays having a plurality of memory cells. These sense amplifiers are connected to bit lines of the respective memory cell arrays by array selection switches. Each of the sense amplifiers is connected to data lines by column switches. An array control portion is provided at each of the memory cell arrays. This array control portion selectively controls the array selection switches and column switches to transmit the data in an arbitrary memory cell in a memory cell array to the data lines through the sense amplifier.

17 Claims, 17 Drawing Sheets

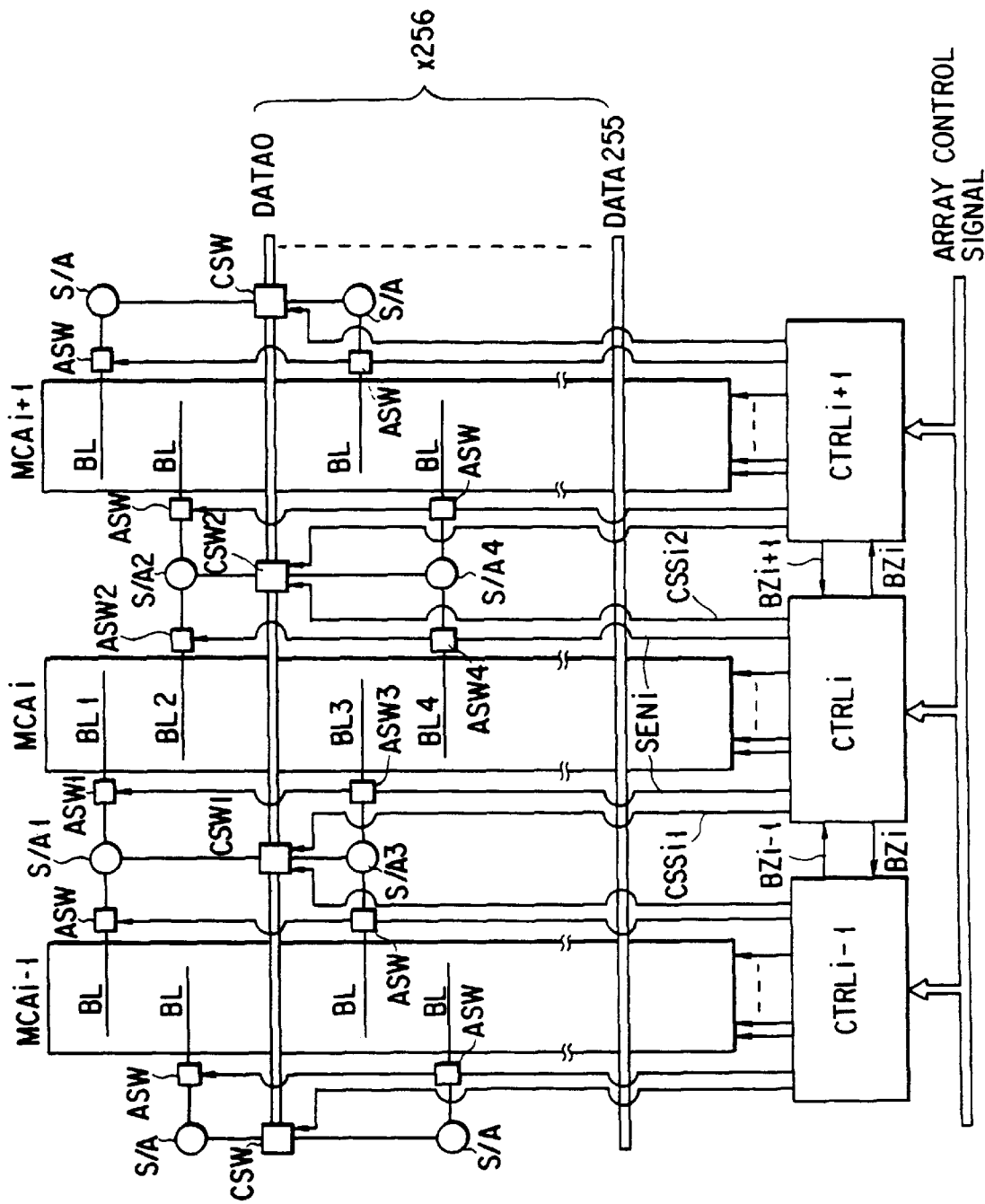
F I G. 1

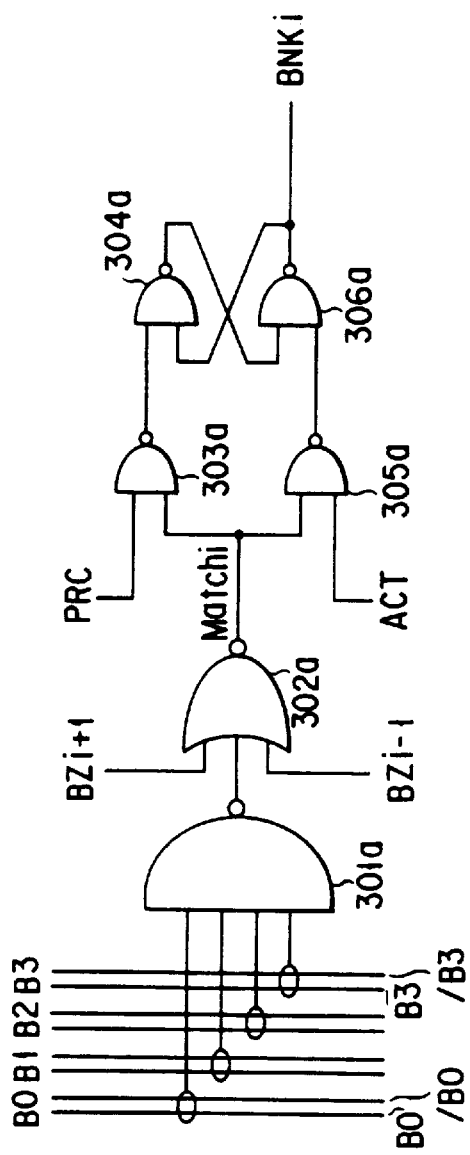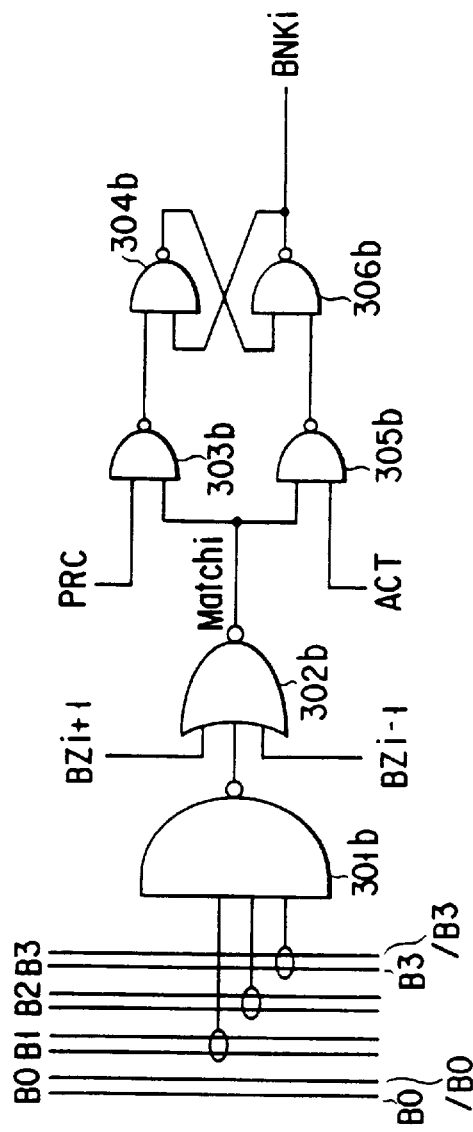
F I G. 3A
F I G. 3B

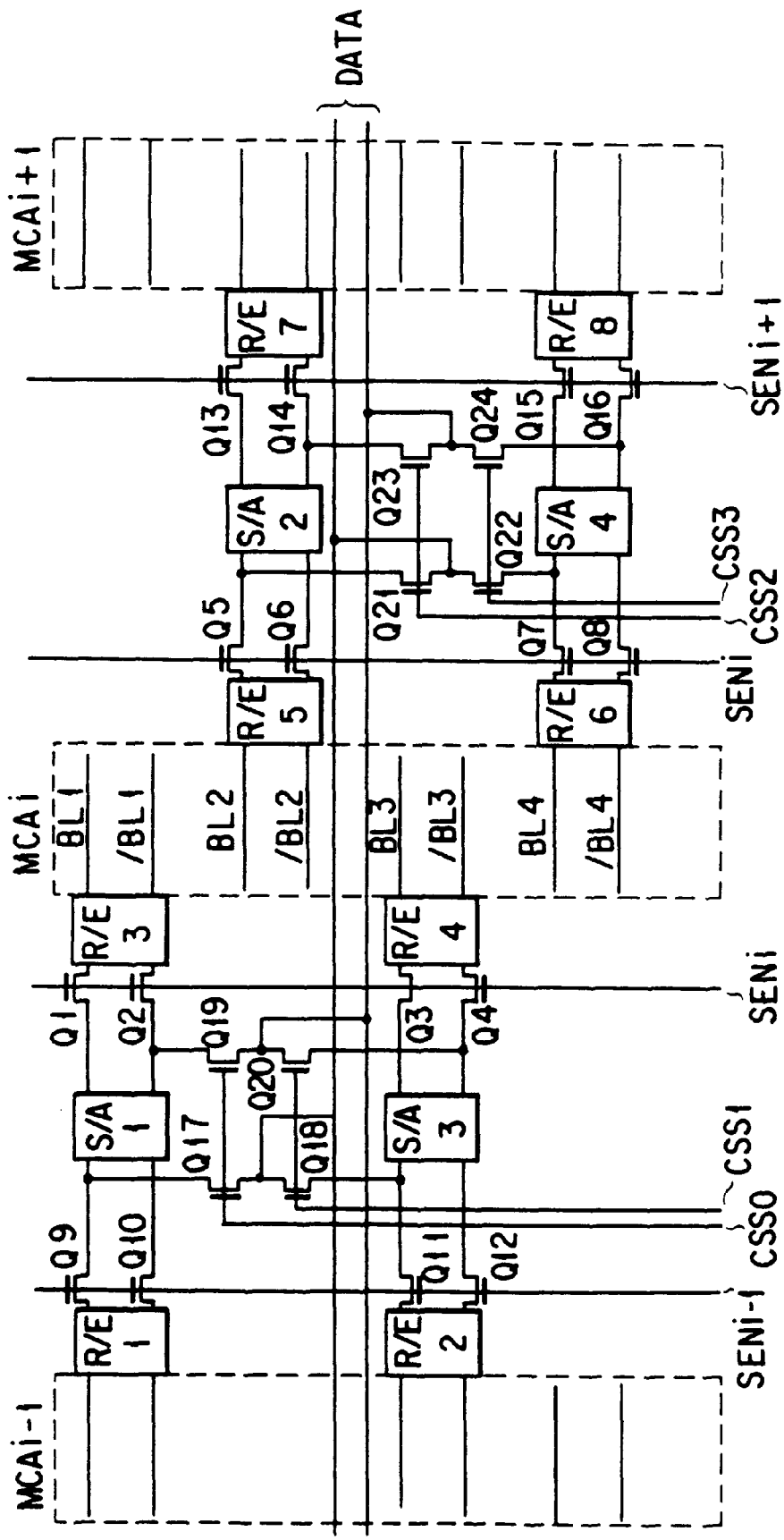
F I G. 6

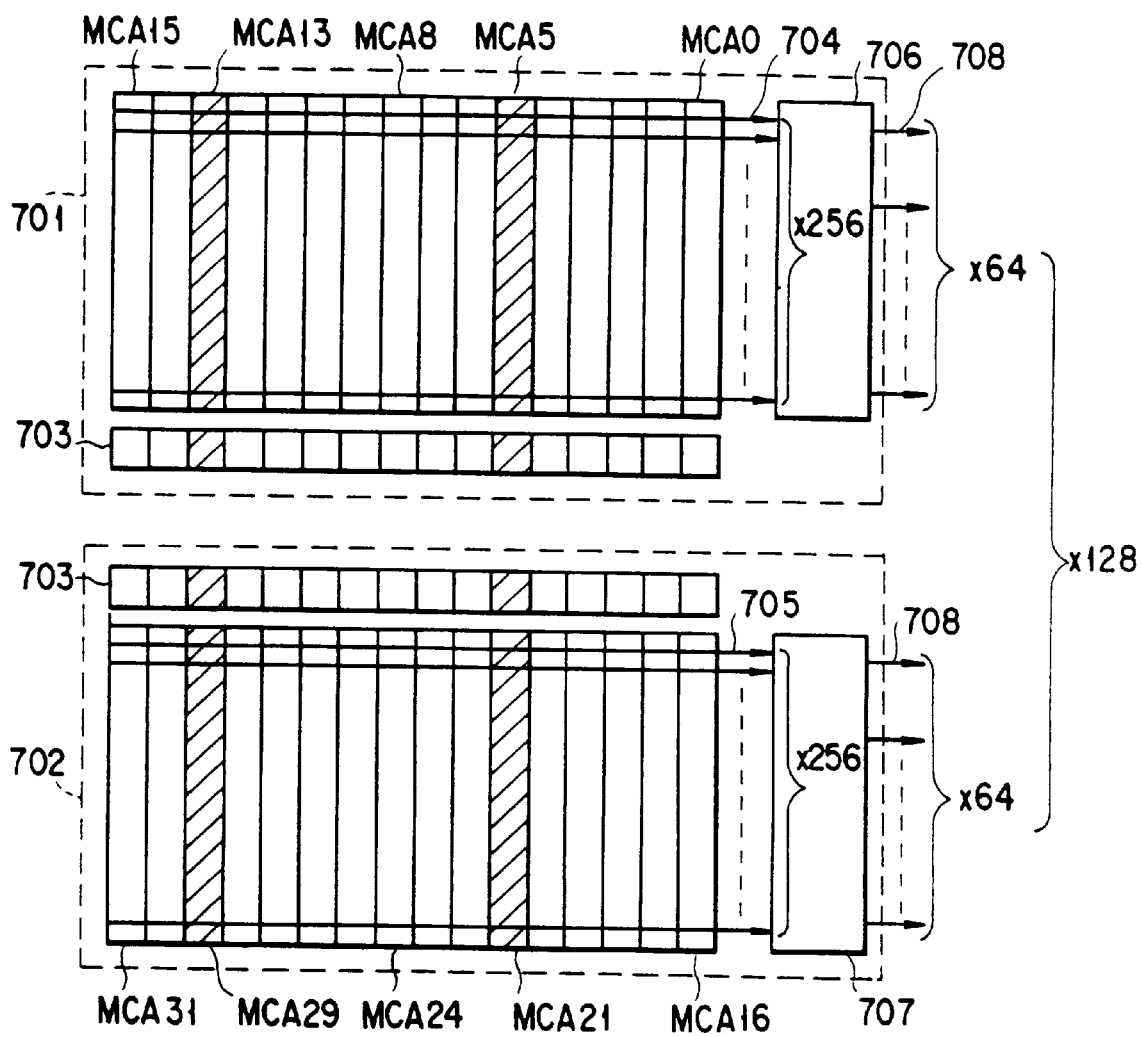
F I G. 7

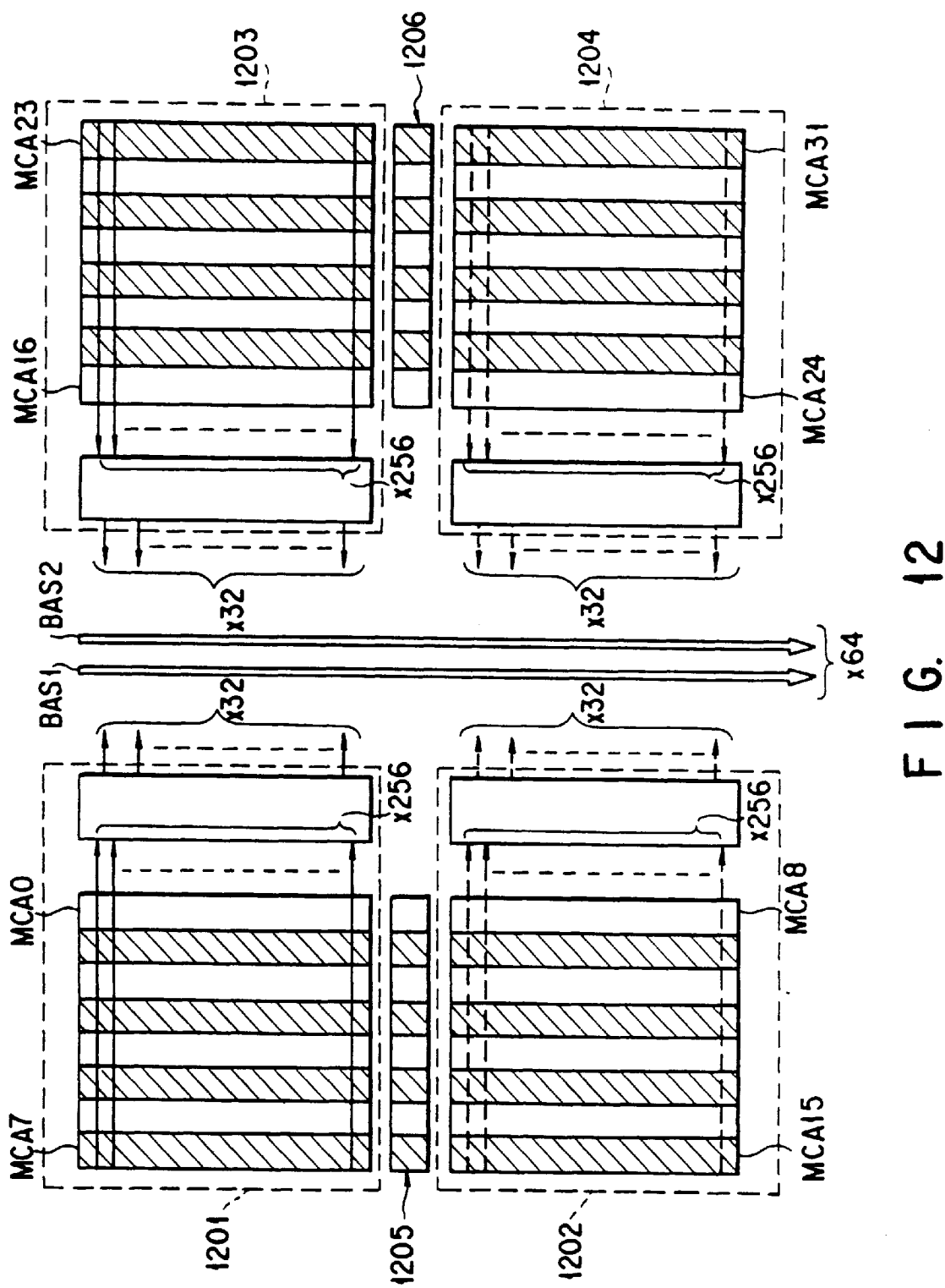
F I G. 12

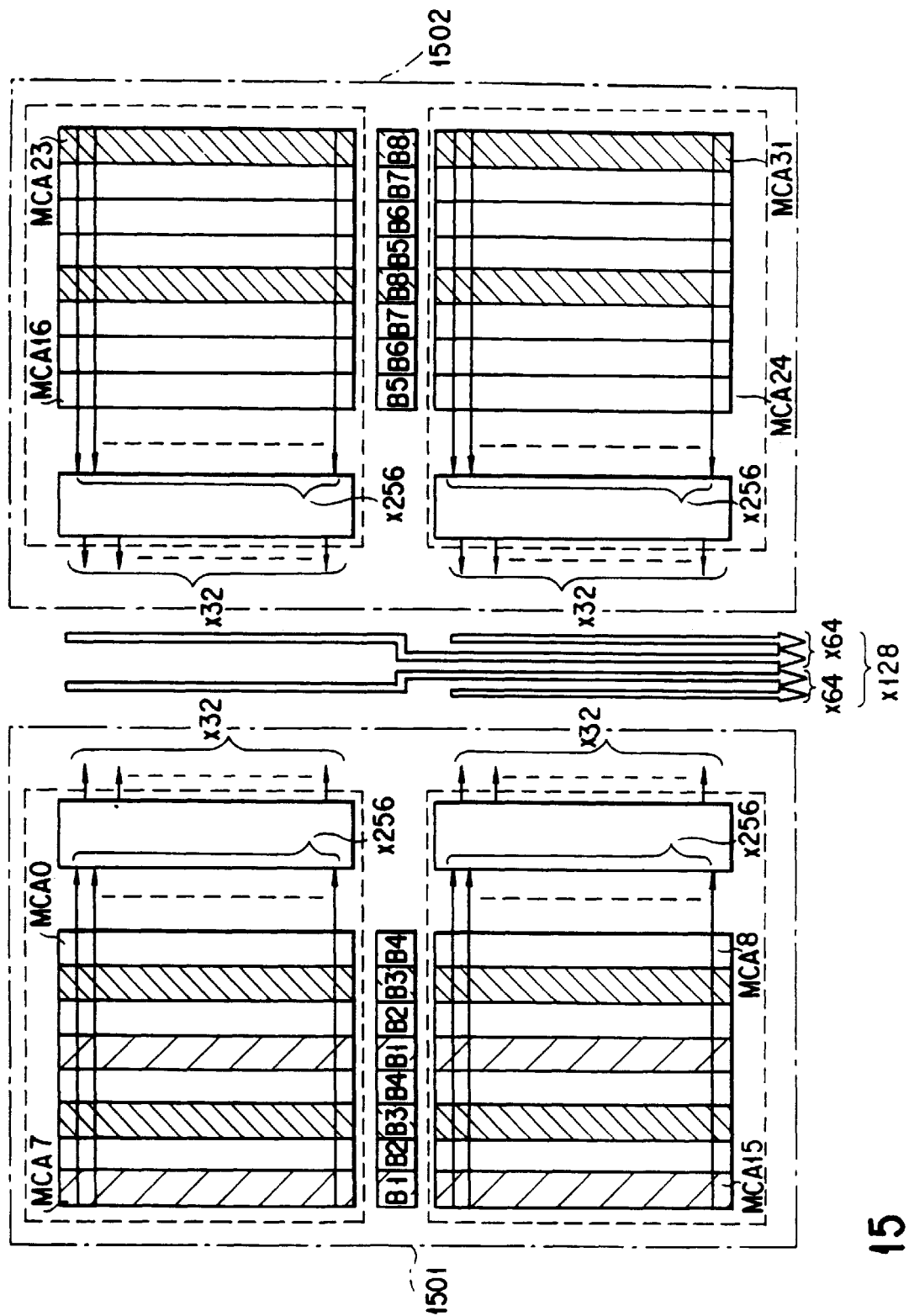
F I G. 15

SEMICONDUCTOR MEMORY WITH TRANSFER BUFFER STRUCTURE

This is a continuation of application Ser. No. 08/814,979 filed Mar. 11, 1997, now U.S. Pat. No. 5,978,300, which application is hereby incorporated by reference in its entirety.

BACKGROUND OF THE INVENTION

The present invention relates to a semiconductor memory having an overlaid bus structure and a control circuit for the same.

Recent demands for reduction in the number of parts of apparatuses associated with a trend toward portable apparatuses, reduction in power consumption, and higher speed and expanded bit widths for improved data transfer efficiency have resulted in an increased need for the so-called memories combined with logic wherein memories of various capacities and configurations are combined with logic systems performing various kinds of data processing into a single IC chip.

In most cases, a bus for exchanging data between a memory portion and a logic portion has a constant width, e.g., 64 or 128 bits. In order to satisfy various requirements of such systems mixed with a logic portion or the like, it is desirable that a memory portion is configured to have a data bus width which remains unchanged irrespective of changes in an address configuration or memory capacity.

In order to satisfy such a need, memory systems having an overlaid bus structure have been proposed.

FIG. 16 shows a circuit configuration of memory cell arrays of a memory system having an overlaid bus structure and a peripheral portion of the same. FIG. 16 focuses on three memory cell arrays among a plurality of memory cell arrays which constitute a memory system. The memory system shown in FIG. 16 employs a shared sense amplifier system in which a sense amplifier is shared by memory cells in adjoining memory cell arrays.

The memory system is formed by memory cell arrays MCAi−1, MCAi, and MCAi+1, data line pairs DATA0 through DATA255 shared by the memory cell arrays, sense amplifiers S/A and S/A1 through S/A4, column switches CSW, CSW1, and CSW2, and a decoder circuit DEC. Each memory cell array has 256 lines and 1024 columns and has 1024 bit line pairs and 256 word lines which are not shown. FIG. 16 shows only bit lines pairs BL and BL1 through BL4. The sense amplifiers S/A and S/A1 through S/A4 are shared by adjoining memory cell arrays. For example, the sense amplifier S/A1 is shared by the memory cell arrays MCAi and MCAi−1, and the sense amplifier S/A2 is shared by the memory cell arrays MCAi and MCAi+1.

BL1 through BL4 of the memory cell array MCAi are connected to sense amplifiers S/A1 through S/A4, respectively. The sense amplifiers S/A1 and S/A3 are connected to the data line pair DATA0 through the columns switch CSW1, and the sense amplifiers S/A2 and S/A4 are connected to the data line pair DATA0 through the column switch CSW2. Therefore, the four sense amplifiers S/A1 through S/A4 of the memory cell array MCAl can be connected to the pair of data lines DATA0. That is, each memory cell array has a common data line pair for every four bit lines. Although not shown, since a memory cell array has 1024 bit line pairs, there are 1024/4=256 pairs of data lines DATA. The operation of this memory system will be described below with reference to an example wherein data on the memory cell array MCAi are read on the data line pairs DATA0 through DATA255.

According to a row address, the decoder circuit DEC selects one word line of the desired memory cell array MCAi. The data on the bit line pairs BL1 through BL4 designated by the selected word line are transmitted to the sense amplifiers S/A1 through S/A4 to activate MCAi. Further, when the sense operation of the sense amplifiers S/A1 through S/A4 is complete, the decoder circuit DEC controls turning on/off of the column switches CSW1 and CSW2 according to a column address to transmit the data sensed and held by one of the sense amplifiers S/A1 through S/A4 to the data line pair DATA0. Thus, the data in the memory cell selected according to the column address on the word line selected according to the row address are transmitted to the data line pair DATA0. Since data are similarly transmitted to the data line pairs DATA1 through DATA255, data are transmitted to 256 pairs of data lines in total.

FIG. 17 shows a configuration of a memory system with a data bus having a width of 128 I/O as an example of a memory system utilizing the above-described overlaid structure.

The memory system is formed by two blocks 1701 and 1702 which are each formed by sixteen memory cell arrays MCA0 through MCA15 and MCA16 through MCA31, respectively. Each of the memory cell arrays has 256 rows and 1024 columns, which means that the total capacity of the memory system is 8 megabit.

There are groups of data lines 1704 and 1705 each consisting of 256 data lines which can be connected to the memory cell arrays MCA0 through MCA15 and MCA16 through MCA31, respectively, in the direction of the bit lines of the memory cell arrays. The groups of data lines 1704 and 1705 are connected to column decoders 1706 and 1707, respectively. A decoder circuit 1703 is provided between the blocks 1701 and 1702 and is shared by those blocks to control the selection of word lines and column switches in each of the blocks simultaneously.

The decoder circuit 1703 selects arbitrary word lines of, for example, the memory cell arrays MCA5 and MCA21 according to a row address input thereto. The data on the selected word lines are transmitted to the sense amplifier to be sensed (memory cell arrays MCA5 and MCA21 are activated). Next, the decoder circuit 1703 selects the sense amplifier according to a column address input thereto to transmit the data to the groups of data lines 1704 and 1705. The groups of data lines 1704 and 1705 are connected to the column decoders 1706 and 1707, respectively. The column decoders 1706 and 1707 select 64 data lines from among the respective 256 data lines and connect them to data buses 1708 and 1709, respectively.

As described above, there are upper and lower data buses of 64 I/O each which provide an overall bus width of 128 I/O.

The capacity of a memory system having such a structure can be increased or decreased by increasing or decreasing the number of memory cell arrays MCA. However, this will not increase or decrease the number of the data lines. It is therefore possible to always maintain a constant data bus width.

A description will now be made on a case wherein data are read from the memory cell arrays MCA13 and MCA29 after the data in the memory cell arrays MCA5 and MCA 21 are read.

First, the data in the memory cell arrays MCA5 and MCA21 are read according to the procedure described above. Next, the decoder circuit resets and precharges the memory cell arrays MCA5 and MCA21 which have been in an activated state. Then, the decoder circuit 1703 selects arbitrary word lines of the memory cell arrays MCA13 and MCA29 according to a row address input thereto. The data on the selected word lines are transmitted to the sense amplifier to be sensed (memory cell arrays MCA13 and MCA29 are activated). Next, the decoder circuit 1703 selects the sense amplifier according to a column address input thereto to transmit the data to the groups of data lines 1704 and 1705. The data on the groups of data lines 1704 and 1705 are input to the colum n decoders 1706 and 1707, respectively. The column decoders 1706 and 1707 select 64 data lines from among the respective 256 data lines and connect them to data buses 1708 and 1709, respectively.

As described above, the memory cell arrays are activated and precharged according to the row addresses decoded by the decoder circuit 1703. Therefore, the operation of reading the data in the different memory cell arrays proceeds in a sequence such that the memory cell arrays MCA5 and MCA21 are activated; the data are read from the same; the memory cell arrays MCA5 and MCA21 are reset and precharged; the memory cell arrays MCA13 and MCA29 are activated; and then the data are read from the same. Thus, the operations of activating, resetting and precharging a memory cell are required each time it is read.

Further, in the above-described example, one each memory cell array is activated in the blocks 1701 and 1702 simultaneously. However, it is possible to activate a plurality of memory cell arrays simultaneously by adjusting the numbers of bits of addresses input to a word line selection portion and a column switch selection portion (which are not shown) in the decoder circuit 1703. For example, if one of the bits of an input row address is used for controlling a column switch along with a column address instead of being used for selecting a word line, two memory cell arrays are activated in each of the blocks 1701 and 1702. In this case, the memory cell arrays MCA0, MCA8, MCA16, and MCA24 are activated simultaneously and, similarly, the memory cell arrays MCA5, MCA13, MCA21, and MCA29 are activated simultaneously.

Thus, when two memory cell arrays are simultaneously activated in each of the blocks 1701 and 1702, the operation of reading the data in the memory cell arrays MCA13 and YCA29 after reading the data in the memory cell arrays MCA5 and MCA21 as described above proceeds in a sequence such that the memory cell arrays MCA5, MCA13, MCA21, and MCA29 are activated; data are read from the memory cell arrays MCA5 and MCA13 are read; and then data are read from the memory cell arrays MCA13 and MCA29. Thus, the resetting and precharging of the memory cells can be omitted.

Even in such a case, however, there are predetermined combinations of memory cell arrays that can be activated simultaneously, and the activation, resetting, and precharging are required for an operation of reading data from memory cell arrays which are not activated simultaneously (e.g., MCA5, MCA21 and MCA3 and MCA19).

As described above, in a conventional memory system of the overlaid type, memory cell arrays must be activated, reset, and precharged when data are read therefrom, which has placed a limit on efforts for increasing the speed of data reading operations.

BRIEF SUMMARY OF THE INVENTION

It is an object of the present invention to provide an overlaid type memory system in which any reduction in the speed of reading from different memory cell arrays associated with activation, resetting, and precharging of the same is avoided by activating each of the memory cell arrays independently of other memory cell arrays and by maintaining each of the memory cell arrays in an activated state.

The object of the present invention is achieved by the configurations described below.

According to a first aspect of the present invention, there is provided a semiconductor memory comprising:
 a plurality of memory cell arrays including a plurality of memory cells;
 a plurality of sense amplifiers;
 a plurality of data lines connected to the plurality of sense amplifiers; and
 a plurality of array control portions differently provided in association with each of the plurality of memory cell arrays for transmitting data in any of the memory cells of the memory cell arrays to the sense amplifiers and for transmitting data in any of the sense amplifiers to the data lines.

According to a second aspect of the present invention, there is provided a semiconductor memory comprising:
 a first memory cell array having a first bit line pair;
 a second memory cell array having a second bit line pair and a third bit line pair;
 a third memory cell array having a fourth bit line pair;
 a first sense amplifier disposed between the first and second memory cell arrays;
 a second sense amplifier disposed between the second and third memory cell arrays;
 a first array selection switch for controlling connection between the first bit line pair and the first sense amplifier;
 a second array selection switch for controlling connection between the second bit line pair and the first sense amplifier;
 a third array selection switch for controlling connection between the third bit line pair and the second sense amplifier;
 a fourth array selection switch for controlling connection between the fourth bit line pair and the second sense amplifier;
 a pair of data lines shared by the first, second, and third memory cell arrays;
 a first column switch for controlling connection between the first sense amplifier and the pair of data lines;
 a second column switch for controlling connection between the second sense amplifier and the pair of data lines;
 a first array control portion provided in association with the first memory cell array for controlling the turning on/off of the first array selection switch and the first column switch;
 a second array control portion provided in association with the second memory cell array for controlling the turning on/off of the second and third array selection switches and the first and second column switches; and
 a third array control portion provided in association with the third memory cell array for controlling the turning on/off of the fourth array selection switch and the second column switch.

According to a third aspect of the present invention, there is provided a semiconductor memory comprising:
 three or more memory cell arrays having different bank addresses;

a plurality of data lines connected to each of the three or more memory cell arrays;

an array control portion provided in association with each of the three or more memory cell arrays; and a supply means for supplying array control signals for controlling the memory cell arrays to the array control portions, each of the plurality of array control portions transmitting data on an arbitrary word line of the memory cell array associated with an array control signal supplied by the supply means to a sense amplifier, transmitting arbitrary data in the sense amplifier to the data lines thereafter, and precharging the sense amplifier thereafter.

According to a fourth aspect of the present invention, there is provided a semiconductor memory comprising:

two or more blocks including three or more memory cell arrays having different bank addresses, a plurality of data lines connected to each of the three or more memory cell arrays, and an array control portion provided in association with each of the three or more memory cell arrays; and a supply means for supplying array control signals for controlling the memory cell arrays to the array control portions, each of the array control portions transmitting data on an arbitrary word line of the memory cell array associated with an array control signal supplied by the supply means to a sense amplifier, transmitting arbitrary data in the sense amplifier to the data lines thereafter, and precharging the sense amplifier thereafter.

According to a fifth aspect of the present invention, there is provided a semiconductor memory comprising:

two or more first blocks including three or more memory cell arrays having different bank addresses and a plurality of data lines connected to each of the three or more memory cell arrays;

two or more second blocks including an array control portion provided in association the two or more first blocks and two or more memory cell arrays having the same bank address as the two or more first banks; and a supply means for supplying an array control signal for controlling the memory cell arrays to the array control portions, each of the array control portions transmitting data on an arbitrary word line of the memory cell array associated with an array control signal supplied by the supply means to a sense amplifier, transmitting arbitrary data in the sense amplifier to the data lines thereafter, and precharging the sense amplifier thereafter.

According to a sixth aspect of the present invention, there is provided a semiconductor memory comprising:

two or more first blocks including three or more memory cell arrays having different bank addresses and a plurality of data lines connected to each of the three or more memory cell arrays;

at least a second block including an array control portion provided in association with the two or more first blocks and each of two or more memory cell arrays having the same bank address as the two or more first blocks and a supply means for supplying an array control signal for controlling the memory cell arrays to the array control portions, each of the array control portions transmitting data on an arbitrary word line of the memory cell array associated with an array control signal supplied by the supply means to a sense amplifier, transmitting arbitrary data in the sense amplifier to the data lines thereafter, and precharging the sense amplifier thereafter.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 illustrates a basic configuration around memory cell arrays of a semiconductor memory according to the present invention;

FIGS. 3A and 3B illustrate circuit configurations of the array selection decoder of the array control portion shown in FIG. 2;

FIG. 6 illustrates a circuit configuration around memory cell arrays of a semiconductor memory according to the present invention;

FIG. 7 illustrates a configuration of a memory system according to a first embodiment of the present invention;

FIG. 12 illustrates a configuration of a memory system according to a sixth embodiment of the present invention;

FIG. 15 illustrates a configuration of a memory system according to an eighth embodiment of the present invention;

DETAILED DESCRIPTION OF THE INVENTION

FIG. 1 illustrates a circuit configuration of memory cell arrays and of a memory system of a semiconductor memory according to the present invention and a peripheral portion of the same. FIG. 1 focuses on three memory cell arrays among a plurality of memory cell arrays which constitute the memory system. The memory system shown in FIG. 1 employs a shared sense amplifier system in which a sense amplifier is shared by memory cells in adjoining memory cell arrays.

This memory system is formed by memory cell arrays MCAi−1, MCAi, and MCAi+1, array control portions CTRLi−1, CTRLi, and CTRLi+1 provided at respective memory cell arrays, 256 data line pairs DATA0 through DATA255 shared by the memory cell arrays, array selection switches ASW and ASW1 through ASW4, sense amplifiers S/A and S/A1 through S/A4, and column switches CSW, CSW1 and CSW2. Each of the memory cell arrays MCAi, MCAi−1, and MCAi+1 has 1024 bit line pairs and 256 word lines. FIG. 1 shows only bit lines pairs BL and BL1 through BL4. The sense amplifiers S/A and S/A1 through S/A4 are shared by adjoining memory cell arrays. For example, the sense amplifiers S/A1 and S/A3 are shared by the memory cell arrays MCAi and MCAi−1, and the sense amplifiers S/A2 and S/A4 are shared by the memory cell arrays MCAi and MCAi+1.

Figure 16:
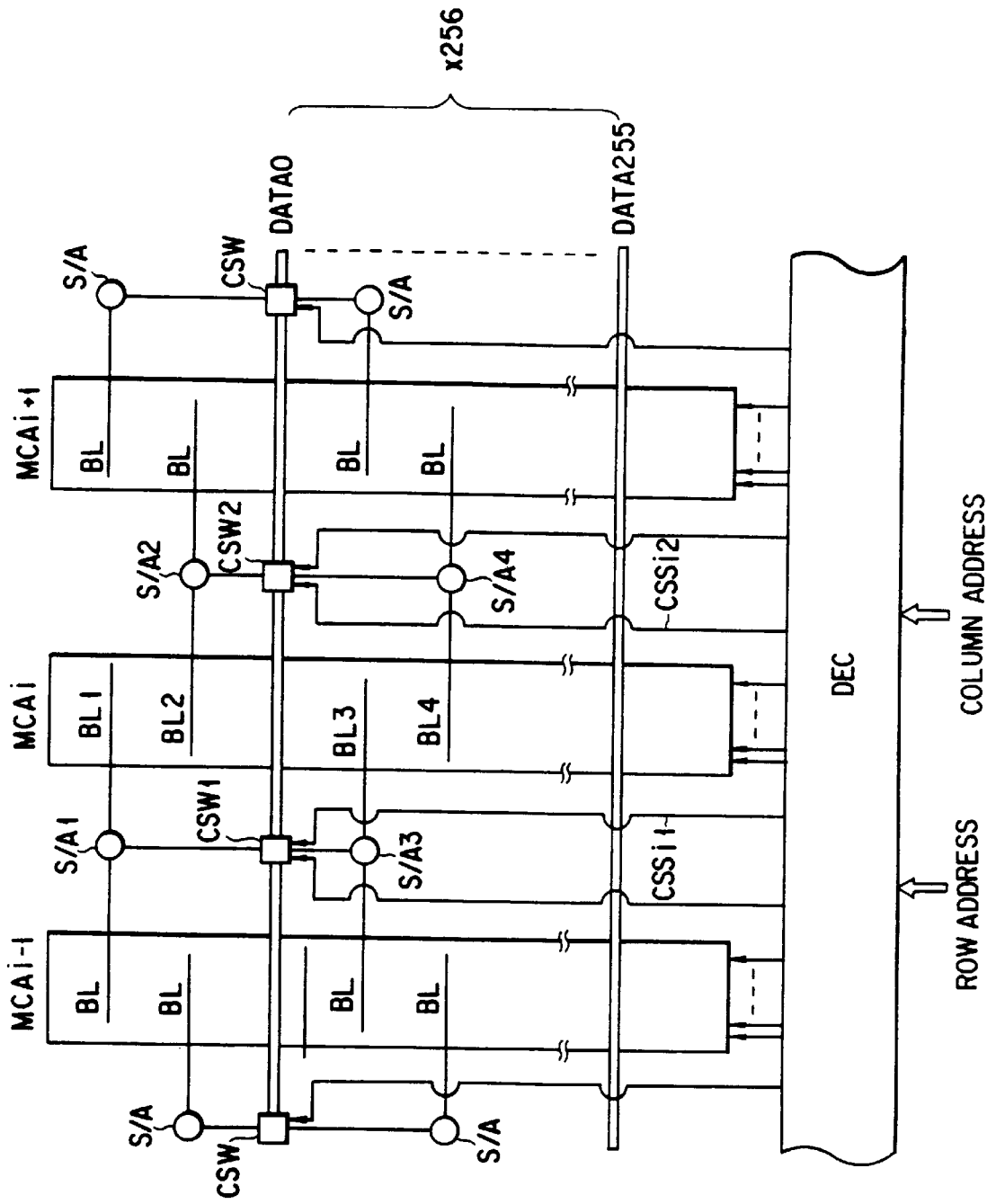
FIG. 16 illustrates a basic configuration around memory cell arrays of a conventional semiconductor memory.
Figure 17:
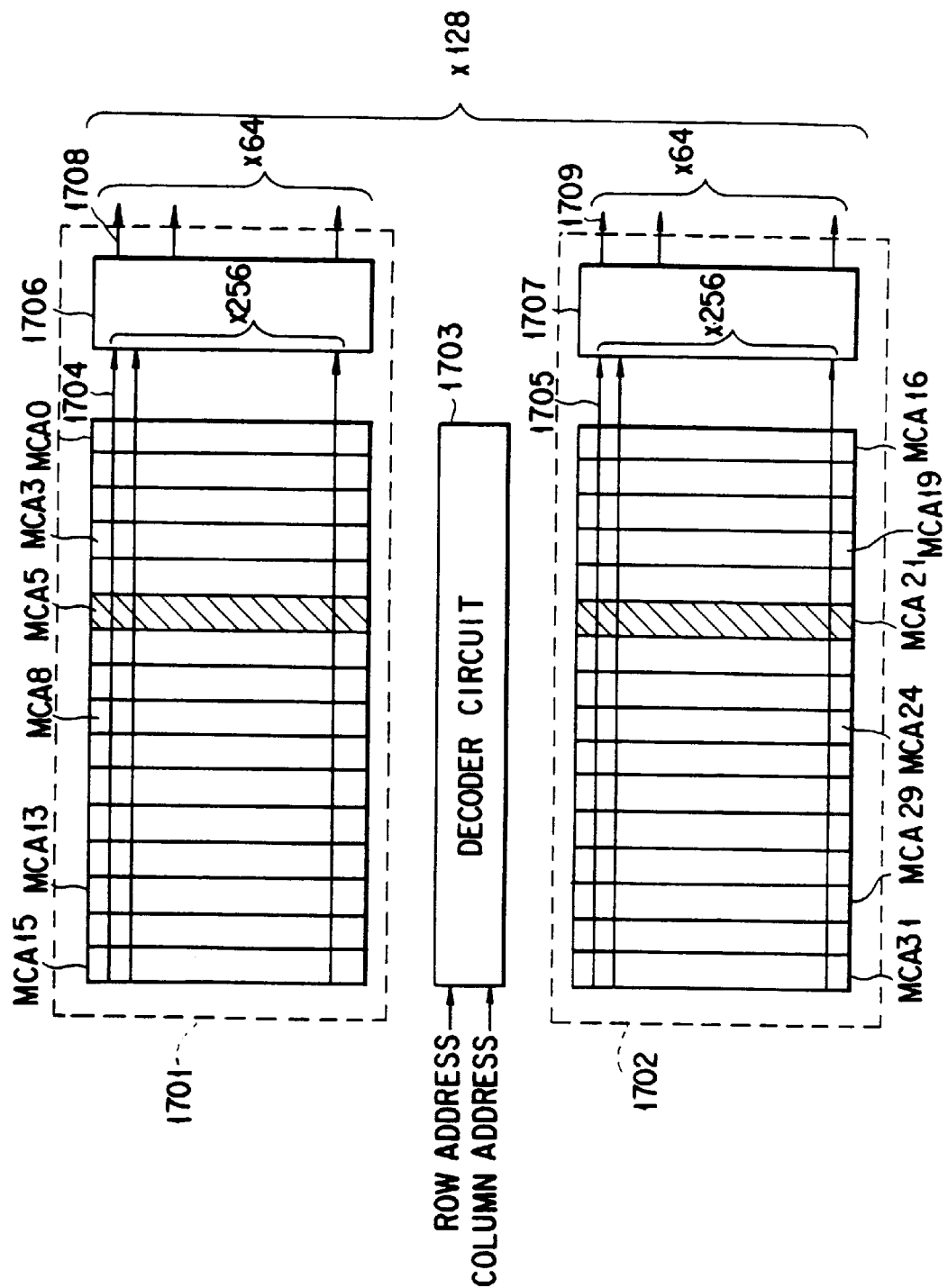
FIG. 17 illustrates a configuration of a conventional memory system.

The bit line pairs BL1 through BL4 of the memory cell array MCAi are respectively connected to sense amplifiers S/A1 through S/A4 via the array selection switches ASW1 through ASW4. The sense amplifiers S/A1 and S/A3 are connected to the data line pair DATA0 through the columns switch CSW1, and the sense amplifiers S/A2 and S/A4 are connected to the data line pair DATA0 through the column switch CSW2. Therefore, the four sense amplifiers S/A1 through S/A4 of the memory cell array MCA1 can be connected to the pair of data lines DATA0. That is, each memory cell array has a common data line pair for every four bit lines. Although not shown, since a memory cell array has 1024 bit line pairs, there are 1024/4=256 pairs of data lines DATA. This system is different from the memory system shown in FIG. 16 in that an array control portion is provided for each of the memory cell arrays and in that the bit lines are connected to the sense amplifiers through the array selection switches. The operation of this memory system will be described below with reference to an example wherein data on the memory cell array MCAi are read on the data line pairs DATA0 through DATA255.

It is determined whether the memory cell array can be activated or not from a bank address included in an array control signal and signals BZi−1 and BZi+1 transmitted by the array control portions CTRLi−1 and CTRLi+1 of the adjacent memory cell arrays MCAi−1 and MCAi+1 indicating whether or not the respective memory cell arrays have been activated. Specifically, the memory cell array MCAi can be activated if the bank address included in the array control signal coincides with the bank address of the memory cell array MCAi and the memory cell arrays MCAi−1 and MCAi+1 have not been activated. If it is determined that the memory cell array MCAi can be activated, the array control portion CTRLi selects an arbitrary word line of the memory cell array MCAi. Further, when this word line is sufficiently boosted, the array control portion CTRLi transmits a signal SENi for turning the array selection switches ASW1 through ASW4 on. Upon receipt of the signal SENi, the array selection switches ASW1 through ASW4 perform such that the bit line pairs BL1 through BL4 of the memory cell array MCAi are connected to the sense amplifiers S/A1 through S/A4. The data on the bit line pairs BL1, BL2, BL3, and BL4 designated by the selected word line are transmitted to the sense amplifiers S/A1 through S/A4 to activate the memory cell array MCAi. When the sense operation of the sense amplifiers S/A1 through S/A4 is complete, the array control portion CTRLi transmits signals CSSi1 and CSSi2 to control the turning on/off of the column switches CSW1 and CSW2 and transmits the data held in one of the sense amplifiers S/A1 through S/A4 to the data line pair DATA0. Thus, the data on the selected bit lines on the selected word line are transferred to the data line pair DATA0 at specified timing. Since data are similarly transmitted to the data line pairs DATA1 through DATA255, data are transmitted to 256 data line pairs in total. When a plurality of memory cell arrays are activated simultaneously, again, the data held in only one of the sense amplifiers S/A are transmitted to a data line pair through control over the turning on/off of a column switch.

Figure 2:
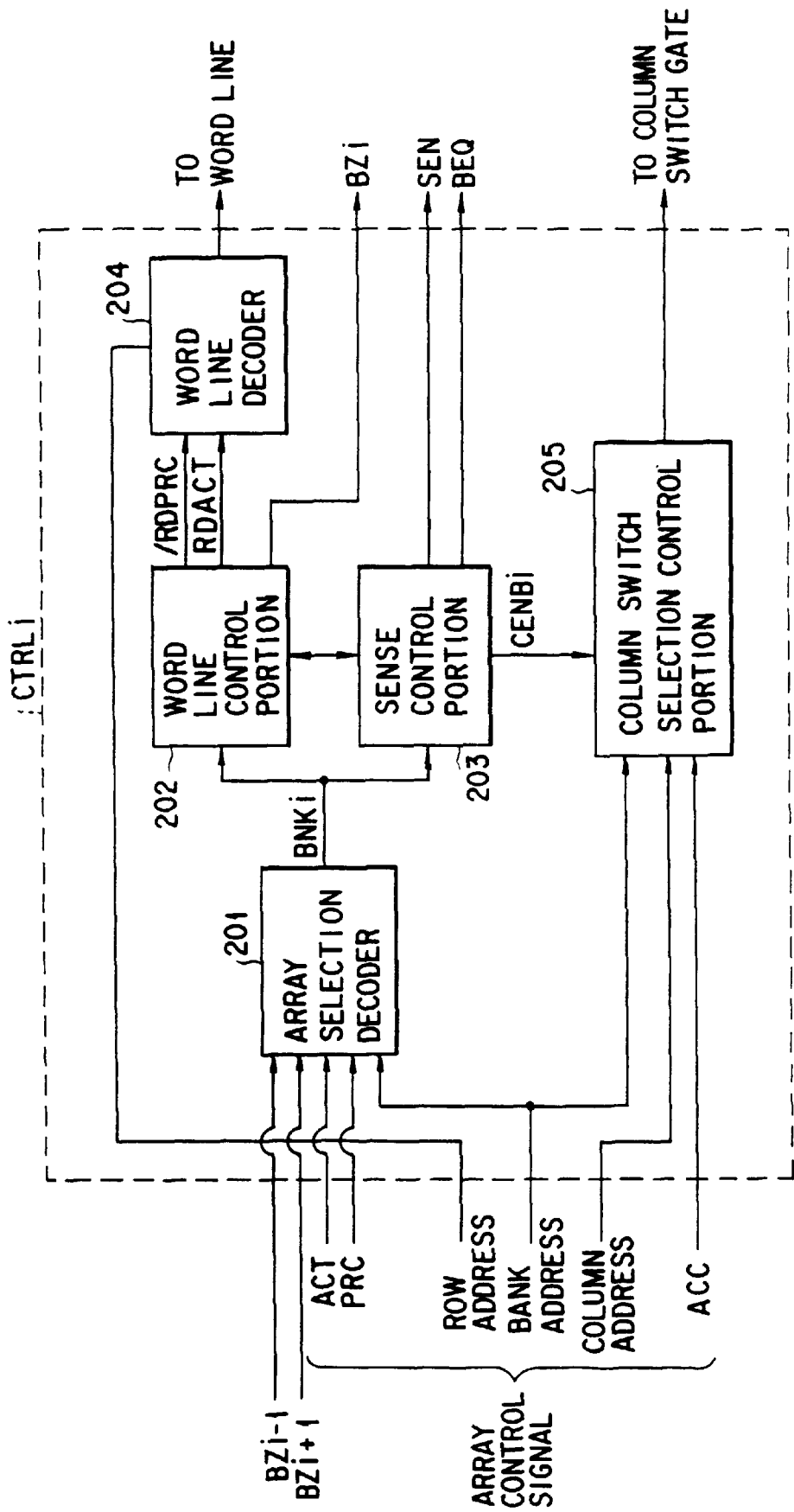
FIG. 2 illustrates a circuit configuration of an array control portion of a semiconductor memory according to the present invention.

Next, FIG. 2 illustrates a circuit configuration of the array control portion CTRLi.

The array control portion CTRLi is formed by an array selection decoder 201, a word line control portion 202, a sense control portion 203, a word line decoder 204, and a column switch selection control portion 205. An array control signal is a signal which is commonly supplied to all array control portions and which includes a bank address, a row address, a column address, and various timing signals. Upon receipt of all or part of the bank addresses included in an array control signal, the array selection decoder 201 determines whether the relevant memory cell array can be selected or not and, if yes, transmits a signal BNKi to the word line control portion 202 and the sense control portion 203 at timing which allows the memory cell array to be activated. In response to the signal BNKi, the word line control portion 202 transmits a signal BZi indicating the relevant memory cell array has been activated to the array control portions of the two memory cell arrays adjacent thereto and transmits signals /RDPRC ("/" symbolizes an inverted signal) and RDACT to the word line decoder 204 for controlling the word line decoder. On the other hand, in response to the signal BNKi, the sense control portion 203 transmits a signal CENBi to the column switch selection control portion 205 after a period required for the word line the selected word line to be completely activated after the transmission of the signals /RDPRC and RDACT by the word line decoder 204 to indicate that data are now ready for transfer out of the cell array and also transmits a signal SEN or BEQ to the sense amplifier to control equalization of the sense amplifier and the bit line. Signals for controlling the operational sequence are exchanged between the word line control portion 202 and the sense control portion 203. The word line decoder 204 decodes a row address upon receipt of the signals /RDPRC and RDACT and transmits a signal for selecting an arbitrary word line. The column switch selection control portion 205 receives a bank address and a signal CEBi transmitted by the sense control portion 203 and, if the relevant memory cell array has been selected and is in a state wherein data are held in the sense amplifier, i.e., the so-called activated state, it decodes a column address at timing for switching the column switches and transmits signals to turn the column switches on and off.

FIG. 3A shows the array selection decoder 201 in detail. B0 through B3 are 4-bit bank addresses and are paired with respective inverted signals /B0 through /B3, and either of them is input to a NAND gate 301a. Therefore, there are sixteen patterns of input to the NAND gate 301a, which means that sixteen bank addresses can be decoded. Specifically, the input signals to the NAND gate 301a of the array control portion associated with the memory cell array having the bank address corresponding to an externally supplied bank address are all "H", and the NAND gates 301a transmit "L". If the signals BZi+1 and BZi−1 are both "L", a NOR gate 302a becomes "H", and a signal Matchi rises. The signals BZi+1 and BZi−1 are signals transmitted by the adjacent memory cell arrays on both sides which becomes "H" if the memory cell arrays have been activated. Since the present embodiment employs the shared sense system wherein a sense amplifier is shared by adjoining memory cell arrays, the array control portion CTRLi can not activate the memory cell array even if the bank address is input if either of the adjoining cell arrays on both sides thereof has been activated. Thus, the signal Matchi becomes "H" when the bank address of the relevant memory cell array is input and the adjacent memory cell arrays on both sides thereof have not been activated.

A signal ACT is a signal indicating timing at which a memory cell array included in an array control signal is to be activated. Further, a signal PRC is a signal indicating timing at which a memory cell array included in an array control signal is put in a precharge state. These signals are pulse signals which becomes "H" for a predetermined period. NANDs 303a through 306a form a flipflop circuit which transmits a signal BNKi which directly controls the word line control portion 202 and the sense control portion 203. The signal BNKi becomes "H" at the time when the signal ACT rises with the signal Matchi at "H". At this time, the memory cell array starts a series of sense operations. Further, the signal BNKi becomes "L" at timing at the time when the signal PRC rises with the signal Matchi at "H". At this time, the memory cell array starts a series of precharge operations. At time other than the above-described two times, since the state of the flipflop circuit formed by the NANDs 303a through 306a is maintained, the state of the signal BNKi is also maintained.

FIG. 3A illustrates a circuit configuration of the array selection decoder wherein one memory cell array is activated at a time in a block consisting of sixteen memory cell arrays. FIG. 3B illustrates a circuit configuration of the array selection decoder wherein two memory cell arrays are activated simultaneously.

When two memory cell arrays are activated simultaneously in a block, two of the sixteen array control portions are activated. Therefore, there are eight patterns of input to NAND gates 301b. Specifically, the input signals to the NAND gates 301b of two array control portions associated with the memory cell arrays having a bank address partially corresponding to an externally supplied bank address are all "H". Thus, with the array selection decoder shown in FIG. 3B, two array control portions perform activation or precharging of the memory cell arrays associated therewith simultaneously.

Figure 4A:
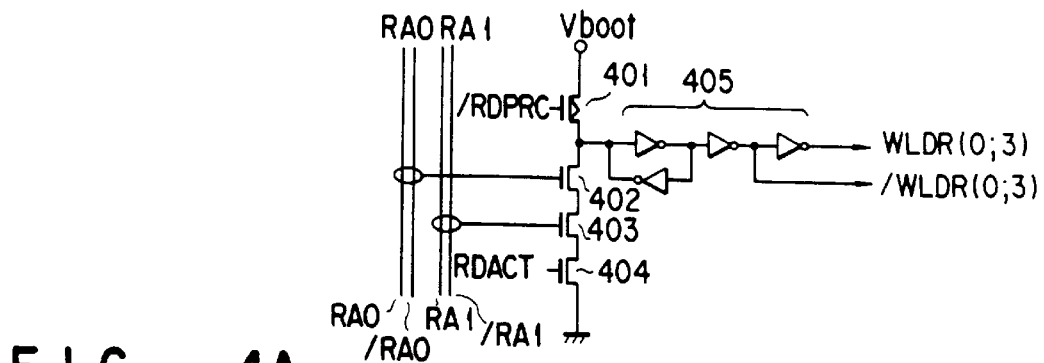
FIGS. 4A through 4D illustrate circuit configurations of the word line decoder of the array control portion shown in FIG. 2.
Figure 4B:
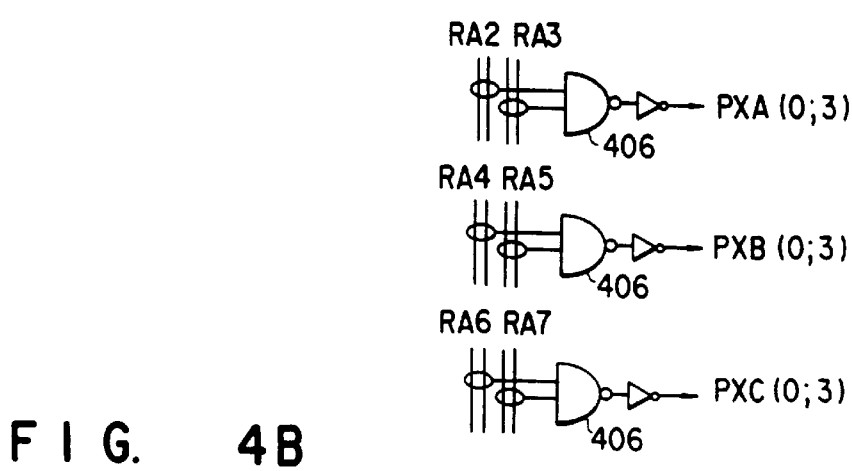
Figure 4C:
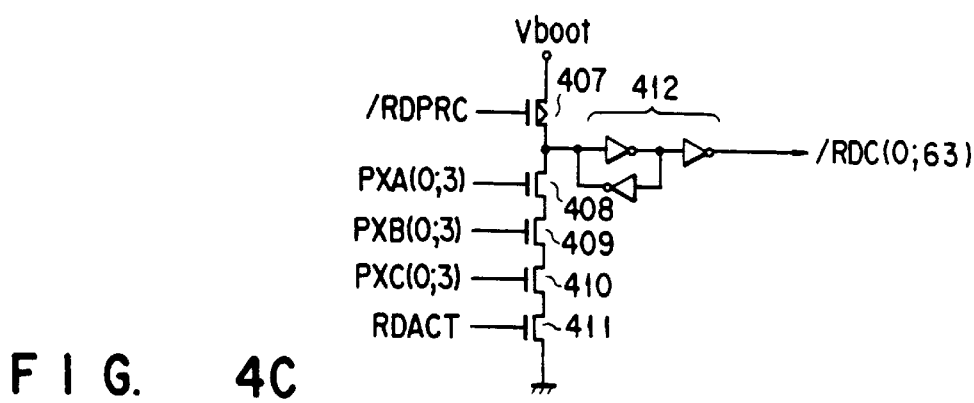
Figure 4D:
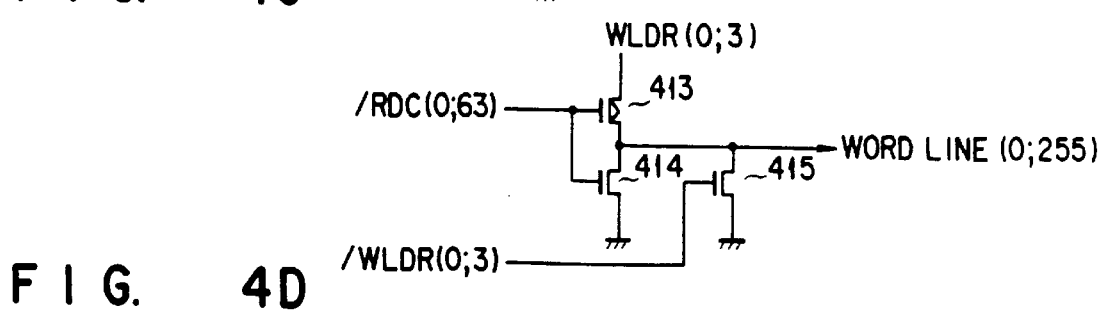

FIGS. 4A through 4D illustrate the word line decoder 204 in detail. FIG. 4A shows a circuit for predecoding a word line drive signal. FIG. 4B shows a row address signal conversion circuit. FIG. 4C shows a converted signal decoding circuit. FIG. 4D shows a word line drive signal generation circuit. A row address is decoded by these four circuits. The operation of these circuits will be described in detail.

The circuit for predecoding a word line drive signal shown in FIG. 4A is formed by a P-channel transistor 401 and N-channel transistors 402, 403, and 404 connected in series between a word line drive voltage Vboot and a ground potential and a latch circuit 405 constituted by an inverter and transmits a word line drive signal WLDR (0;3) and an inverted signal /WLDR (0;3) of the same.

First, when the signal /RDPRC is "L", the transistor 401 is turned on, and the connection point between the transistors 401 and 402 is precharged. Next, when this signal becomes "H" to turn the transistor 401 off, the transistor 404 is turned on at the time when the signal RDACT which is subjected to transition in the form of a pulse becomes "H" to decode row addresses RA0 and RA1. The decoded row addresses RA0 and RA1 are transmitted after being converted into the word line drive signal WLDR (0;3) and the inverted signal /WLDR (0;3) of the same. RA0 and RA1 are two bits of a row address. RA0 and RA1 are paired with inverted signals /RA0 and /RA1, respectively, and either of them is input to each of the N-channel transistors 402 and 403. Further, the signal RDACT is a signal which is "H" in the period when the corresponding memory cell array is activated. Therefore, the word line decoder 204 decodes a row address only at the time when the memory cell array associated therewith is activated.

The row address signal conversion circuit shown in FIG. 4B is formed by a NAND gate 406 to which two bits each of row addresses are input and an inverter. For example, RA2 and RA3 are paired with their inverted signals /RA2 and /RA3, and either of them is input to the NAND gate 406 which in turn transmits a signal PXA (0;3) through the inverter. Similarly, a signal PXB (0;3) is generated in accordance with row addresses RA4 and RA5, and a signal PXC (0;3) is generated in accordance with row addresses RA6 and RA7.

The conversion signal decode circuit shown in FIG. 4C is a circuit which further decodes the signals PXA (0;3), PXB (0;3), and PXC (0;3) obtained by the conversion at the row address signal conversion circuit shown in FIG. 4B. This circuit is formed by a P-channel transistor 407 and N-channel transistors 408, 409, 410, and 411 connected in series between the word line drive voltage Vboot and the ground potential and a latch circuit 412 constituted by an inverter and transmits an inverted signal /RDC (0;63) of a word line decode signal. Each of the transistors 408, 409, and 410 receives any one of the signals PXA (0;3), PXB (0;3), and PXC (0;3) at its gate input and performs decoding operation similar to that of the circuit for predecoding a word line drive signal shown in FIG. 4A.

The word line drive signal generation circuit shown in FIG. 4D is formed by a P-channel transistor 413 and N-channel transistors 414 and 415 and is connected to word lines of memory cell arrays at its output. The output signals WLDR (0;3) and /WLDR (0;3) of the circuit for predecoding a word line drive signal shown in FIG. 4A and the output signals /RDC (0;63) of the converted signal decode circuit shown in FIG. 4C control the turning on/off of the transistors 413, 414, and 415. Then, "H" is transmitted to the selected word line, and the ground potential is transmitted to other word lines.

The circuitry of the system driving the word lines and sense amplifiers is as described above. A cell array selected according to a bank address is driven by a closed circuit in that array. Therefore, a memory cell array forming a part of a block can be controlled irrespective of the state of other memory cell arrays. Further, the activated state of a memory cell array is maintained until the memory cell array is put in a precharged state.

Figure 5A:
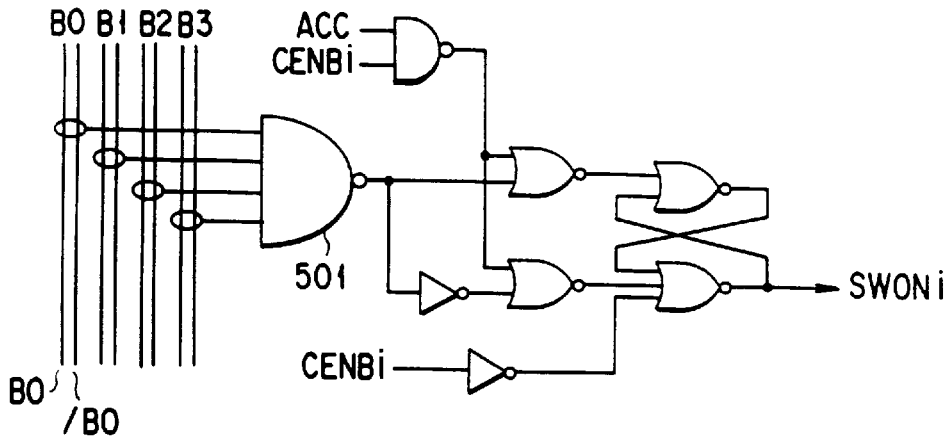
FIGS. 5A through 5C illustrate circuit configurations of the word line column switch selection control portion of the array control portion shown in FIG. 2.
Figure 5B:
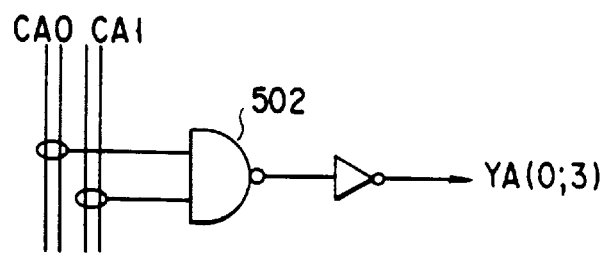
Figure 5C:
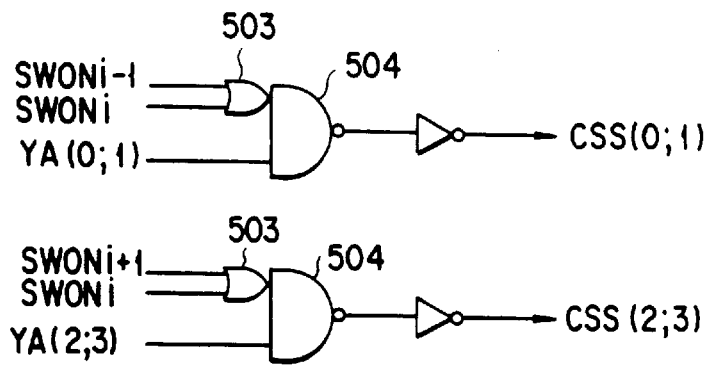

FIGS. 5A through 5C illustrate the column switch selection control portion 205 in detail. The column switch selection control portion controls a switching system for connecting data lines and sense amplifiers to allow exchange of data with an activated cell array. FIG. 5A shows a switch control signal generation circuit. FIG. 5B shows a column address predecode circuit. FIG. 5C shows a column address decode circuit.

In the switch control signal generation circuit shown in FIG. 5A, B0 through B3 designate 4-bit bank addresses and are paired with respective inverted signals /B0 through /B3, and either of them is input to a NAND gate 501. Specifically, if an externally supplied bank address coincides with the bank address of a memory cell array set in an array control portion, the input signals to the NAND gate 501 of the array control portion are all "H", and the NAND gate 501 transmits "L". A signal CENBi is a signal transmitted by the sense control portion 203 and which becomes "H" if the corresponding memory cell array has completed a sense operation and data are held in the sense amplifier. A signal ACC is a signal which determines timing for controlling column switches. The switch control signal generation circuit put a signal SWONi in a "H" state at the time when the activation signal ACC becomes "H" if the bank address of the corresponding memory cell has been input and that memory cell has been activated. At this time, the column switch of the corresponding memory cell array is enabled. If the bank address of the corresponding memory cell array has not been input, the signal SWONi becomes "L", and the column switch of this memory cell array does not operate. If the corresponding memory cell array is in the precharge state, the signal CENBi becomes "L". In this case, the signal SWONi also becomes "L", and the column switch of this memory cell array does not operate.

The column address predecode circuit shown in FIG. 5B is formed by a NAND gate 502 to which two bits of a column address are input and an inverter. CA2 and CA3 are paired with inverted signals /CA2 and /CA3, respectively, and either of them is input to a NAND gate 502 which transmits a signal YA (0;3) through the inverter.

In the column address decode circuit shown in FIG. 5C, an OR gate 503 receives the input of the signal SWONi transmitted by the switch control signal generation circuit and signals SWONi-1 transmitted by the switch control signal generation circuits of the adjacent array control portions on both sides thereof. The output of this OR gate 503 and the output signal YA (0;1) of the column address predecode circuit shown in FIG. 5B are input to a NAND gate 504 which in turn transmits a signal CSS (0;1) through the inverter. Similarly, a signal CSS (2;3) is generated. This signal CSS (0;3) is a signal for controlling the turning on/off of four column switches.

Each memory cell array has four column switch control signal lines. Further, since the present invention employs the shared sense system wherein a sense amplifier is shared by adjacent memory cell arrays on both sides thereof, two of the column switch control signal lines are shared by a memory cell array associated therewith and the memory cell array preceding the same and are controlled by the signal CSS (0;1), and the remaining two lines are shared by the memory cell array associated and the memory cell succeeding the same and are controlled by the signal CSS (2;3). When either the memory cell array concerned or one of the adjacent memory cell array controls the column switch in response to the signal SWONi which becomes "H" when the column switch of the memory cell array concerned is controlled or the signal SWONi-1 which becomes "H" when the column switch of the adjacent memory cell array is controlled, the signal CSS (0;1) decodes the signal YA (0;1) and transmits the column switch control signal CSS (0;1). Similarly, when either the memory cell array concerned or the other adjacent memory cell array controls the column switch, the column switch control signal CSS (2;3) decodes the signal YA (2;3) and transmits the column switch control signal CSS (2;3).

If all bits of a bank address are input to the switch control signal generation circuit shown in FIG. 5A, even if a plurality of memory cell arrays are activated, the column switches can be controlled by one memory cell array. This is because memory cell arrays that form a block have different addresses.

While the array control operation has been described with reference to FIGS. 3A through 5C, a detailed description will now be made with reference to FIG. 6 on an operation wherein a sense amplifier and a column switch are controlled by various signals transmitted by an array control portion to read data from a memory cell array. FIG. 6 is a detailed version of FIG. 1.

The memory cell array MCAi has 1024 bit line pairs such as BL1 and /BL1. Although not shown, 128 memory cells are actually connected to each of these bit lines and, therefore, 256 memory cells are connected to one bit line pair, i.e., one sense amplifier. The sense amplifiers S/A1 through S/A4 are shared by adjacent memory cell arrays on both sides thereof, and the turning on/off of array selection gates Q1, Q2, Q3, Q4, Q5, Q6, Q7, Q8, . . . , Q16 determines the memory cell array to which each sense amplifier is connected. For example, if the memory cell array MCAi is selected, the array selection switch control signal SENi becomes "H" to turn the array selection gates Q1, Q2, Q3, Q4, Q5, Q6, Q7, and Q8 on and to connect the bit lines BL1, /BL1, BL2, /BL2, BL3, /BL3, BL4, and /BL4 to the sense amplifiers S/A1, S/A2, S/A3, and S/A4. At this time, since the memory cell arrays MCAi−1 and MCAi+1 are not selected, the array selection switch control signals SENi−1 and SENi+1 are "L", and the array selection gates Q9, Q10, Q11, Q12, Q13, Q14, Q15, and Q16 are off. Thus, the bit line pairs and sense amplifiers of the selected memory cell array are connected to drive the sense amplifiers.

A restore/equalize portion R/E has the function of reading the H level of the bit lines properly to allow sufficient charge to be rewritten in the cell and also equalizing the bit line pairs during precharging to generate a reference potential during a sense operation. This portion is controlled by a signal BEQ output by a sense control circuit.

The data defined in the sense amplifiers S/A1, S/A2, S/A3, and S/A4 are selected by column switches Q17, Q18, Q19, Q20, Q21, Q22, Q23, and Q24 and are connected to a pair of data lines DATA to be transferred.

A description will now be made on a case wherein a pair of data on the bit lines BL1, /BL1, BL2, /BL2, BL3, /BL3, BL4, and /BL4 of the memory cell array MCAi are transferred to the data lines DATA. The memory cell array is selected, and an arbitrary word line in the memory cell array MCAi is selected, although not shown. Since the memory cell array MCAi is selected, the array selection switch control signal SENi becomes "H" to turn the array selection gates Q1, Q2, Q3, Q4, Q5, Q6, Q7, and Q8 on and to connect the bit lines BL1 and /BL1 to the sense amplifiers S/A1. Similarly, the bit lines BL2 and /BL2 are connected to the sense amplifier S/A2; bit lines BL3 and /BL3 are connected to the sense amplifier S/A3; and the bit lines BL4 and /BL4 are connected to the sense amplifier S/A4. At this time, since the memory cell arrays MCAi−1 and MCAi+1 are not selected, the array selection switch control signals SENi−1 and SENi+1 are "L", and the array selection gates Q9, Q10, Q11, Q12, Q13, Q14, Q15, and Q16 are off. When a sense amplifier S/A completes sensing, the column switch control signals CSS (0;1) and CSS (2;3) are transmitted. If the data on the bit lines BL1 and /BL1 are selected from a column address, a signal CSS0 becomes "H" and signals CSS1, CSS2, and CSS3 become "L". When the column switch control signal CSS0 becomes "H", the transistors Q17 and Q19 forming a column switch is turned on to select the data held in the sense amplifier S/A1 and to transfer it to the data line pair DATA. At this time, since the column switch control signals CSS1, CSS2, and CSS3 are "L", the transistors Q18, Q19, Q20, Q21, Q22, Q23, and Q24 are off. Thus, the switches can be controlled to take out arbitrary data in the memory cell array onto the data lines.

A description will now be made with reference to the drawings on a method of controlling a memory system according to the present invention by referring to an actual configuration of the same as an example.

FIG. 7 shows a configuration of a memory system with a data bus having a width of 128 I/O as a first example of the present invention. Like the conventional memory system shown in FIG. 16, this memory system is formed by two blocks 701 and 702 which are respectively formed by sixteen each memory cell arrays MCA0 through MCA15 and MCA16 through MCA31 having different bank addresses. Each of the memory cell arrays has 256 rows and 1024 columns, which means that the total capacity of the memory system is 8 megabit.

The blocks 701 and 702 respectively include groups of data lines 704 and 705 each consisting of 256 data lines which can be connected to the sixteen each memory cell arrays MCA0 through MCA15 and MCA16 through MCA31, respectively, in the direction of the bit lines of the memory cell arrays. The groups of data lines 704 and 705 are connected to column decoders 706 and 707, respectively. Each of the memory cell arrays includes an array control portion 703 to which a common array control signal is supplied, although not shown. Opposite memory cell arrays belonging to the blocks 701 and 702 have the same bank address.

When the bank address of a memory cell array associated with a array control portion 703 coincides with a bank address included in the array control signal, the array control portion 703 activates the memory cell array associated therewith in accordance with the bank address and row addresses. For example, when the bank address of the memory cell arrays MCA5 and MCA21 is input, the array control portions of the memory cell arrays MCA5 and MCA 21 select arbitrary word lines of the memory cell arrays MCA5 and MCA21 and control array selection switches to connect the bit lines of the memory cell arrays MCA5 and MCA21 to the sense amplifier. The data on the selected word lines are transmitted to the sense amplifier to be sensed (the memory cell arrays MCA5 and MCA21 are activated). Next, when the bank address of a memory cell array associated with a array control portion 703 coincides with a bank address included in the array control signal, the array control portion 703 reads the data in the memory cell array associated therewith in accordance with the bank address and column addresses. For example, when the bank address of the memory cell arrays MCA5 and MCA21 is input, the array control portions of the memory cell arrays MCA5 and MCA 21 turn arbitrary column switches of the memory cell arrays MCA5 and MCA21 on and off to transmit the data sensed in the sense amplifier to the data lines 704 and 705. The signals on the data lines 704 and 705 are input to the column decoders 706 and 707, respectively. The column decoders 706 and 707 select 64 data lines from among the respective 256 data lines and connect them to data buses 708 and 709, respectively.

As described above, there are upper and lower data buses of 64 I/O each which provide an overall bus width of 128 I/O.

A description will now be made on a case wherein data are read from the memory cell arrays MCA13 and MCA29 after the data in the memory cell arrays MCA5 and MCA 21 are read.

First, the data in the memory cell arrays MCA5 and MCA21 are read according to the procedure described above. Thereafter, the memory cell arrays MCA5 and MCA21 are maintained in an activated state until those memory cell arrays are precharged. Next, regardless of the activated state of the memory cell arrays MCA5 and MCA21, array control portions 703 activate memory cell arrays associated therewith according to the array control signal. The array control portions of the memory cell arrays MCA13 and MCA29 activate those memory cell arrays in accordance with the bank address of the Memory cell arrays MCA13 and MCA29. Now, the memory system has four activated memory cell arrays MCA5, MCA13, MCA21, and MCA29. Next, the array control portions 703 reads the data in the memory cell arrays associated therewith according to the array control signal. Specifically, the array control portions of the memory cell arrays MCA13 and MCA29 performs control such that the data in the memory cell arrays MCA13 and MCA29 are read. At this time, since the bank address of the memory cell arrays MCA5 and MCA21 is not input to the array control portions, no data is transmitted from the memory cell arrays MCA5 and MCA21.

Thus, the array control portion provided at each memory cell array controls the corresponding memory cell array regardless of the state of other memory cell arrays. Therefore, the operation of reading the data in the different memory cell arrays proceeds in a sequence such that the memory cell arrays MCA5 and MCA21 are activated; the data are read from the same; the memory cell arrays MCA13 and MCA31 are activated; and then the data are read from the same. This eliminates the need for an operation of precharging the memory cell arrays MCA5 and MCA21.

When the reading of the data in the memory cell arrays MCA5 and MCA21 is followed by the reading of the data in MCA13 and MCA29 and then by further reading of the data in the memory cell arrays MCA5 and MCA21, the memory cell arrays MCA5 and MCA21 are already in an activated state at the second reading.

Thus, the array control portion provided at each memory cell array can maintain the activated state of the memory cell array until it is precharged. Therefore, the operation of the second reading proceeds in a sequence such that the memory cell arrays MCA5 and MCA21 are activated; the data are read from the same; the memory cell arrays MCA13 and MCA29 are activated; the data are read from the same; and the data in the memory cell arrays MCA5 and MCA21 are read. This eliminates the need for an operation of activating the memory cell arrays MCA5 and MCA21 for the second time and therefore makes it possible to increase the speed of the data reading operation.

As described above, the memory system according to the first embodiment of the present invention allows memory cell arrays which are not adjacent to each other to be freely activated and therefore makes it possible to reduce the number of activating and precharging operations compared to conventional memory systems.

Further, it is possible to activate a plurality of memory cell arrays in the same block simultaneously by inputting a part of the bits of a bank address to the array selection decoder circuit of an array control portion. In this case, the array selection decoder circuit of an array control portion will have the configuration shown in FIG. 3B.

For example, two memory cell arrays are simultaneously activated in each of the blocks 701 and 702. Specifically, the memory cell arrays MCA0, MCA8, MCA16, and MCA24 are simultaneously activated. Other combinations of memory cell arrays are also possible.

When a part of bank addresses included in an array control signal coincides with a part of the bank addresses of memory cell arrays, the array control portions 703 concerned activates the memory cell arrays associated therewith in accordance with the part of bank addresses and column addresses. For example, when a part of the bank addresses of the memory cell arrays MCA5, MCA13, MCA21, and MCA29 is input, the array control portions of the memory cell arrays MCA5, MCA13, MCA21, and MCA29 select arbitrary word lines of the memory cell arrays MCA5, MCA13, MCA21, and MCA29 and control array selection switches to connect the bit lines of the memory cell arrays MCA5, MCA13, MCA21, and MCA29 to the sense amplifiers. The data on the selected word lines are transmitted to the sense amplifiers to be sensed (the memory cell arrays MCA5, MCA13, MCA21, and MCA29 are activated). Next, when a bank address included in an array control signal coincides with the bank address of a memory cell array, the array control portion 703 associated therewith reads the data in the memory cell array associated therewith in accordance with the bank address and column addresses. For example, when the bank address of the memory cell arrays MCA5 and MCA21 is input, the array control portions of the memory cell arrays MCA5 and MCA 21 turn arbitrary column switches of the memory cell arrays MCA5 and MCA21 on and off to transmit the data sensed in the sense amplifier to the data lines 704 and 705. The data on the data lines 704 and 705 are input to the column decoders circuits 706 and 707, respectively. The column decoders 706 and 707 select 64 data lines from among the respective 256 data lines and connect them to data buses 708 and 709, respectively. Thus, the data in the memory cell arrays MCA5 and MCA21 are read. At this time, since the bank address of the memory cell arrays MCA13 and MCA29 is not input, the data in MCA13 and MCA19 are not transmitted.

Further, it is possible to activate memory cell arrays which are not adjacent to each other, e.g., the memory cell arrays MCA0, MCA8, MCA16, and MCA24 with the memory cell arrays MCA5, MCA13, MCA21, and MCA29 maintained in an activated state.

Since the memory cell arrays MCA0 through MCA15 share the data lines 704 and the memory cell arrays MCA16 through MCA31 share the data lines 705, each of the blocks 701 and 702 has 256 data lines. Each of the column decoders 706 and 707 selects 64 data lines from among the 256 data lines and connects them to the data bus 708. As a result, the two blocks provide 128 data buses in total. The numbers of the data lines selected by the column decoders 706 and 707 are determined by the numbers of I/O buffer circuits of the data lines provided in the circuit blocks of the column decoders 706 and 707. Specifically, an increase in the width of the data buses output by the column decoders 706 and 707 will result in an increase in the number of the I/O buffer circuits provided for the respective outputs, which increases the area occupied by the I/O buffer circuits. Conversely, a decrease in the width of the data buses output by the column decoders 706 and 707 will result in a decrease in the number of the I/O buffer circuits provided for the respective outputs, which decreases the area occupied by the I/O buffer circuits.

The number of the memory cell arrays activated simultaneously is determined by the setting of a refresh cycle and a column depth, i.e., the number of the columns. When two memory cell arrays are simultaneously activated in each of the blocks, the refresh cycle and the column depth will be as follows. Since four memory cell arrays are refreshed simultaneously, the time required for activating all of the memory cell arrays is equal to the time required for activating eight memory cell arrays each having 256 rows. That is, the refresh cycle is 256×8=2048.

Since two memory cell arrays are simultaneously activated in the same block, eight pairs of bit lines are connected to one data line. A column switch CSW selects one of the eight bit pairs and connects it to data lines. Further, a column decoder selects one of four pairs of data lines and connect it to a data bus. Therefore, the number of the bit line pairs connected to one I/O of the data bus is 8×4=32, which means a column depth of 32. In this case, there is provided a system of 2048 rows×32 columns×128 I/O.

As described above, by changing the number of memory cell arrays activated simultaneously, the configuration of rows and columns per I/O can be changed. For example, when four memory cell arrays are simultaneously activated, the refresh cycle is 256×4=1024, which means a column depth of 64. In this case, there is provided a system of 1024 rows×64 columns×128 I/O.

Figure 8:
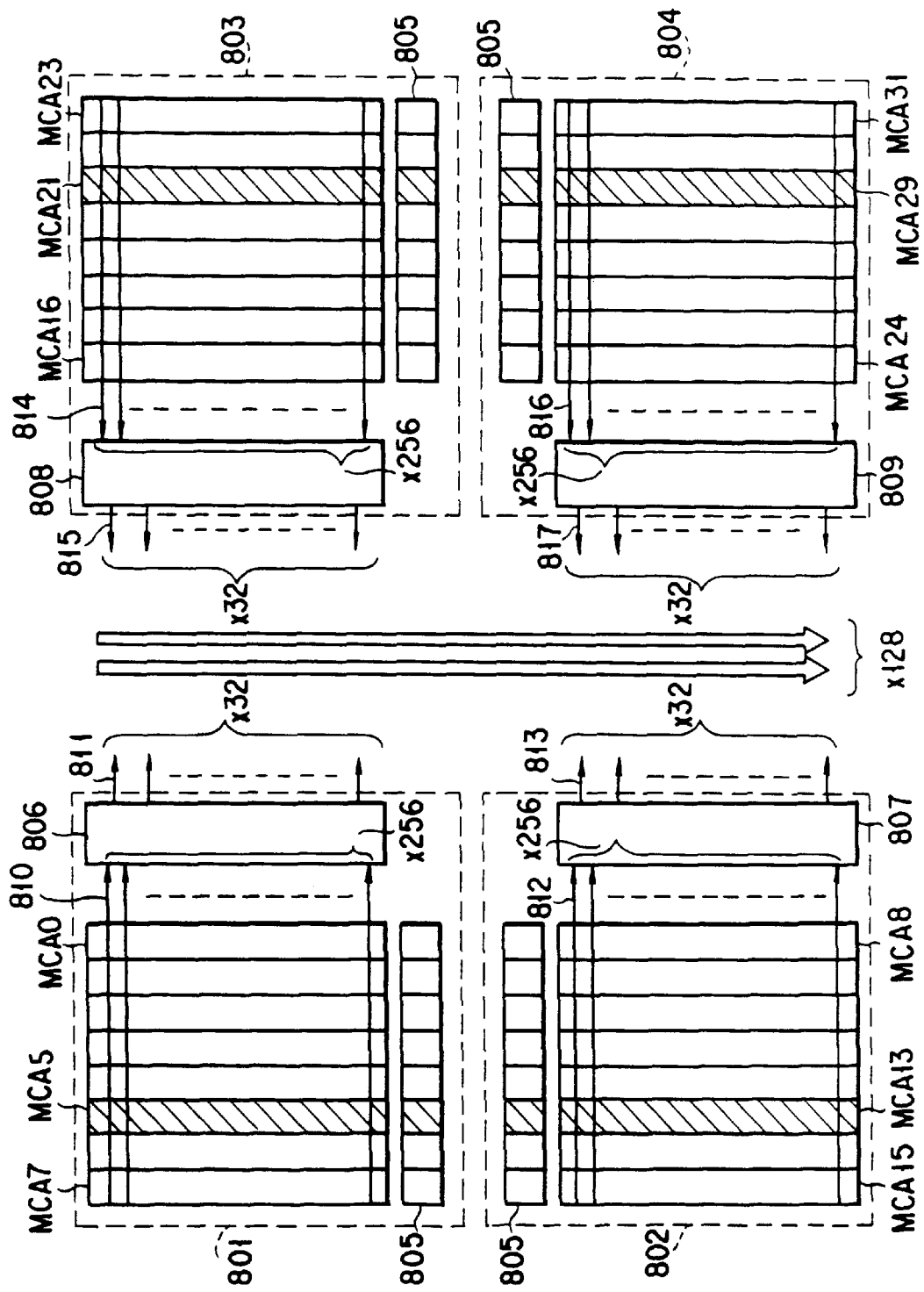
FIG. 8 illustrates a configuration of a memory system according to a second embodiment of the present invention.

Next, as a second embodiment of the invention, FIG. 8 illustrates a configuration of a memory system with a data bus having a width of 128 I/O like the first embodiment. This memory system is formed by four blocks 801 through 804 which are respectively formed by groups each consisting of eight memory cell arrays MCA0 through MCA7, MCA8 through MCA15, MCA16 through MCA23, and MCA24 through MCA31 having different bank addresses. Each memory cell array has 256 rows×1024 columns, and the total capacity of the memory system is 8 megabit.

The blocks 801, 802, 803, and 804 respectively include groups of data lines 810, 812, 814, and 816 in the direction of the bit lines. The memory cell arrays MCA0 through MCA7, MCA8 through MCA15, MCA16 through MCA23, and MCA24 through MCA31 of the respective blocks can be connected to the groups of data lines 810, 812, 814, and 816, respectively. Each of the groups includes 256 data lines. The data lines 810, 812, 814, and 816 are connected to column decoders 806, 807, 808, and 809. Each of the memory cell arrays includes an array control portion 805 to which a common array control signal is supplied, although not shown. Opposite memory cell arrays belonging to an upper block and a lower block have the same bank address. Further, memory cell arrays in positional correspondence between laterally adjoining blocks have the same bank address.

Since the array control portions 805 operate similarly to the array control portions in the above-described first embodiment, this second embodiment also allows memory cell arrays which are not adjacent to each other in each block to be sequentially activated. Further, an activated state can be maintained. It is therefore possible as in the first embodiment to reduce the number of activating and precharging operations during reading from different memory cell arrays.

The refresh cycle of the memory system of the present embodiment is 256×8=2048. The column depth is 4×8=32. In this case, there is provided a system of 2048 rows×32 columns×128 I/O which is equivalent to that obtained in the first embodiment by activating one memory cell array at a time in a single block.

The present embodiment provides a higher data rate that available with the first embodiment because the length of the data lines is reduced. Further, the number of memory cell arrays connected to the data lines is reduced, which reduces the charging and discharging of electrical charge due to stray capacitance to advantageously decrease the drive current.

In a memory system according to the present invention, the choice between the configuration of 1024 rows×64 columns×128 I/O according to the first embodiment and the configuration of 2048 rows×32 columns×128 I/O according to the second embodiment depends on how to exchange data between the system and logic outside the memory. In a DRAM, sense amplifier access time is generally shorter for the columns than the rows.

For example, if requests from logic outside a memory can be satisfied by switching columns, the configuration of 1024 rows×64 columns×128 I/O is preferably chosen for such a memory system to reduce the number of rows selected at a time. On the contrary, if frequent word line switching is required to satisfy requests from logic outside a memory, the configuration of 2048 rows×32 columns×128 I/O is preferably chosen for such a memory system to increase the number of rows selected at a time. As described above, in the case of a memory system combined with logic, a more adequate memory system must be chosen in accordance with requests from the logic or the like outside the memory.

Figure 9:
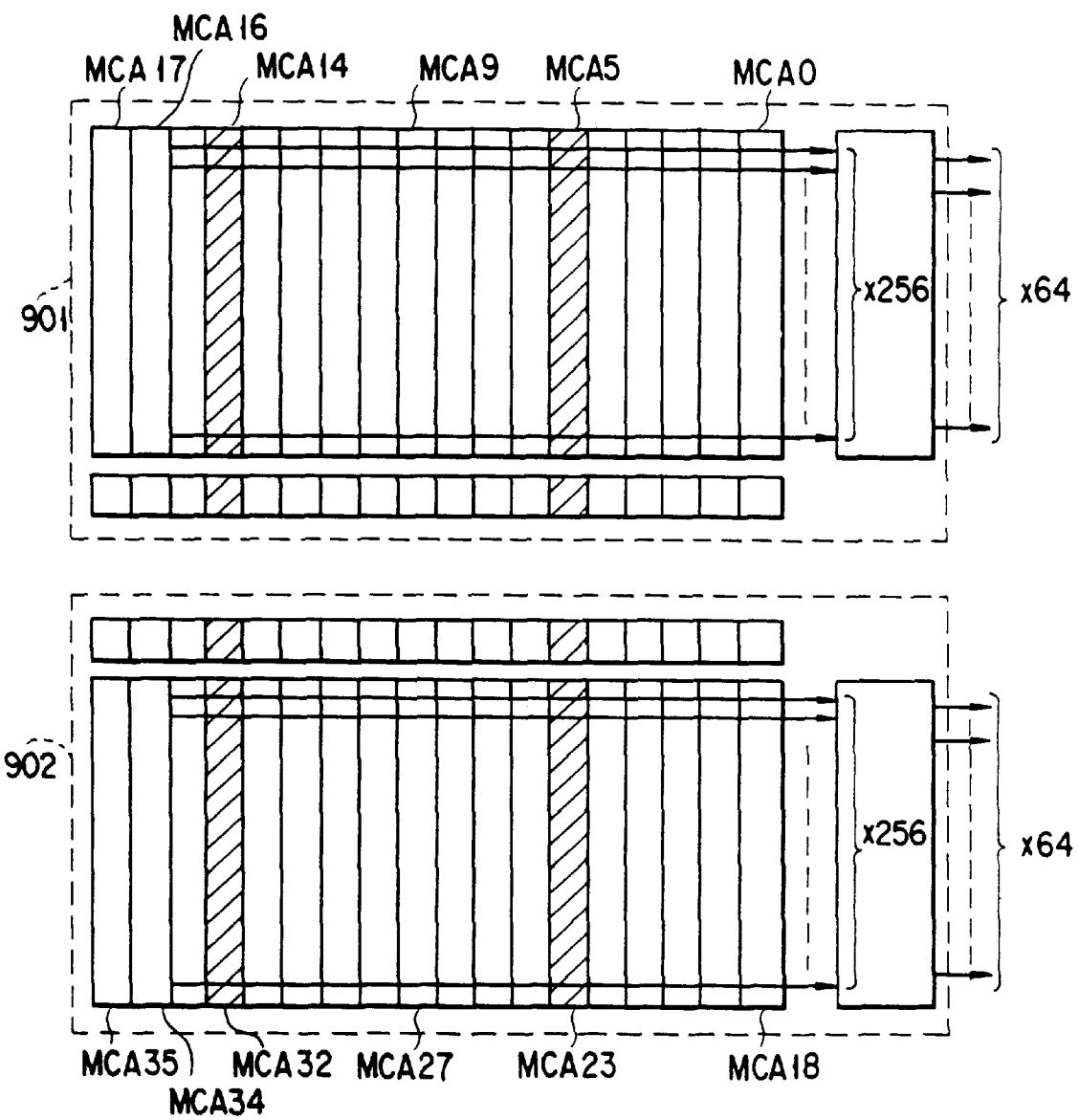
FIG. 9 illustrates a configuration of a memory system according to a third embodiment of the present invention.
Figure 10:
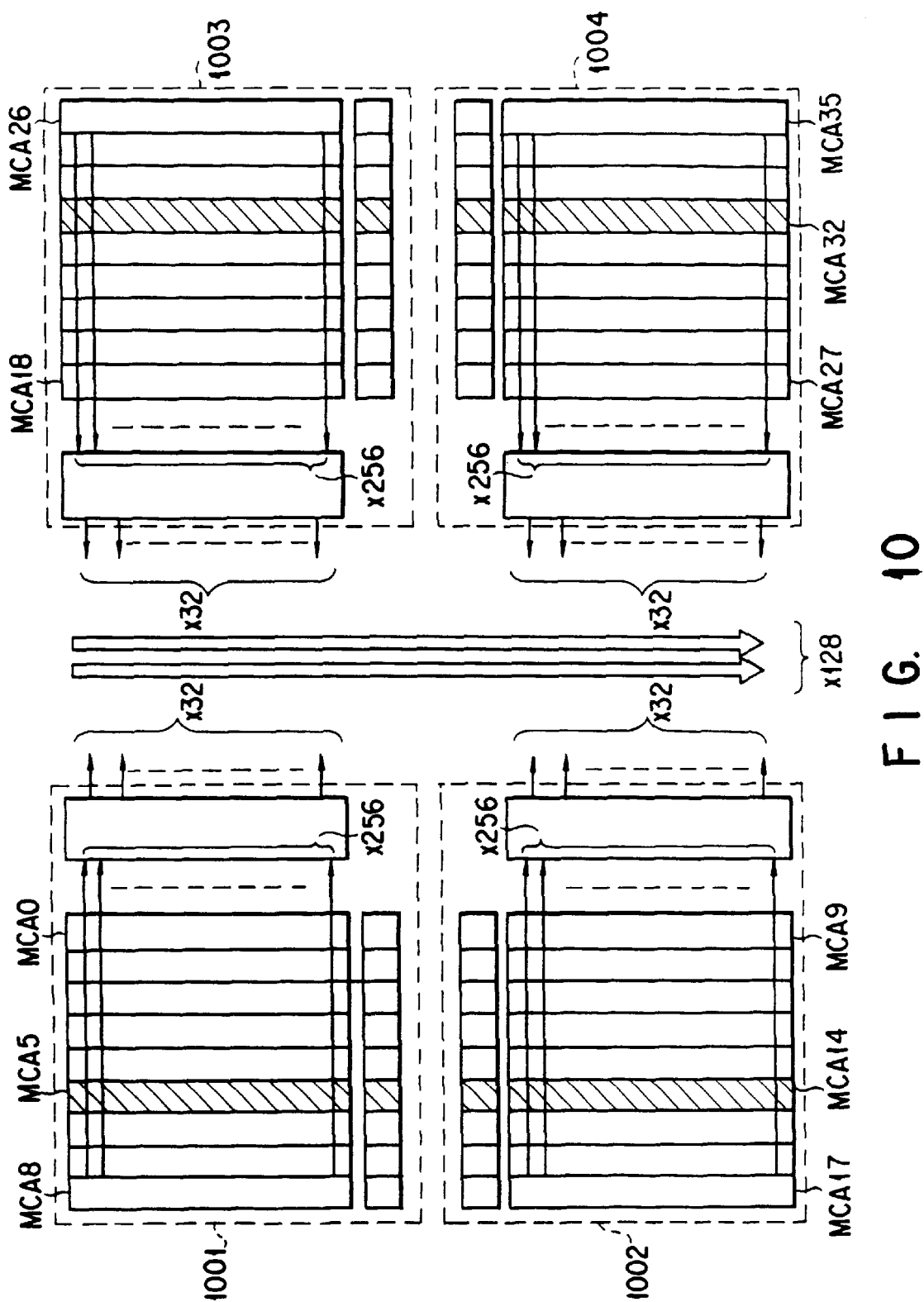
FIG. 10 illustrates a configuration of a memory system according to a fourth embodiment of the present invention.

A description will now be made on third and fourth embodiments of the invention which are modifications of the memory systems according to the first and second embodiments, respectively to increase the total capacity to 9 megabit. FIGS. 9 and 10 show a configuration of a memory cell system according to the third embodiment which corresponds to the first embodiment. Two each memory cell arrays, i.e., MCA16 and MCA17 and MCA34 and MCA35 are respectively added to upper and lower blocks 901 and 902 according to the first embodiment, four memory cell arrays being added in total. The third embodiment is different from the first embodiment in the positions of cell arrays activated simultaneously. According to the first embodiment, as shown in FIG. 7, simultaneous activation of the memory cell arrays takes place in each of banks, e.g., a bank consisting of MCA0, MCA8, MCA16, and MCA24, a bank consisting of MCA1, MCA9, MCA17, and MCA25, a bank consisting of MCA2, MCA10, MCA18, and MCA26, a bank consisting of MCA3, MCA11, MCA19, and MCA27, a bank consisting of MCA4, MCA12, MCA20, and MCA28, a bank consisting of MCA5, MCA13, MCA21, and MCA29, a bank consisting of MCA6, MCA14, MCA22, and MCA30, and a bank consisting of MCA7, MCA15, MCA23, and MCA31. Meanwhile, according to the third embodiment, as shown in FIG. 9, activation takes place in each of a bank consisting of MCA0, MCA9, MCA18, and MCA27, a bank consisting of MCA1, MCA10, MCA19, and MCA28, a bank consisting of MCA2, MCA11, MCA20, and MCA29, a bank consisting of MCA3, MCA12, MCA21, and MCA30, a bank consisting of MCA4, MCA13, MCA22, and MCA31, a bank consisting of MCA5, MCA14, MCA23, and MCA32, a bank consisting of MCA6, MCA15, MCA24, and MCA33, a bank consisting of MCA7, MCA16, MCA25, and MCA36, and a bank consisting of MCA8, MCA17, MCA26, and MCA35.

Since one memory cell array has 256 rows and 1024 columns, two memory cell arrays provide a capacity of 0.5 megabit. It is therefore physically possible to add memory cell arrays MCA16 and MCA34 to blocks 901 and 902, respectively, to configure a memory cell array having a total capacity of 8.5 megabit. Since upper and lower blocks of the present embodiment operate similarly at the same time, only the operation of the upper block 901 will be described. If the added memory cell arrays have the same address as that of the memory cell arrays MCA0, MCA8, and MCA16, three memory cell arrays are activated only when such bank address is specified, and two memory cells are activated when a different bank address is specified. When three memory cell arrays are activated, the column switch selects one of 12 bit line pairs and connects it to the data line. Meanwhile, when two memory cell arrays are activated, the column switch selects one of 8 bit line pairs and connects it to the data line. Thus, the column depth (the number of columns) varies from bank address to bank address. Similarly, if a new bank address is set for the added memory cell array MCA16, activation of one memory cell array takes place only when such a bank address is specified, and two memory cells are activated if a different bank address is specified. In this case, the column depth again varies from bank address to bank address. Thus, the column depth varies if there is no consistency in the number of memory cell arrays simultaneously activated. This results in non-uniformity of an address space, i.e., the column depth varies depending on the memory cell array activated. It is therefore necessary to increase or decrease the number of memory cell arrays using the number of the memory cell arrays activated simultaneously in a block as a unit. This is the reason for the fact that the minimum addition to the total capacity of 8 megabit of the first embodiment results in a memory system having a total capacity of 9 megabit.

FIG. 10 shows a configuration of a memory cell system according to the fourth embodiment which corresponds to the second embodiment. One new memory cell array is added to each of the blocks 801, 802, 803, and 804 of the second embodiment, i.e., four memory cell arrays MCA8, MCA17, MCA26, and MCA35 are added in total. Since it is necessary to increase or decrease the number of memory cell arrays using the number of the memory cell arrays activated simultaneously in a block as a unit as described above, one memory cell array may be added to each of the blocks in this case.

As apparent from the third and fourth embodiments, a constant I/O width can be always maintained even if the number of memory cell arrays is increased. Further, although not shown, a constant I/O width can be always maintained according to the above-described rule even if the number of memory cell arrays is decreased.

More practical embodiments of the present invention will now be described. In the embodiments described below, the array control portions are shared by upper and lower memory cell arrays to activate the upper and lower cell arrays as in pairs instead of providing the array control portions independently for each cell array. In this case, although flexibility of control is reduced because a control circuit is shared by two cell arrays, design flexibility is increased in terms of the surface area of the chip.

Figure 11:
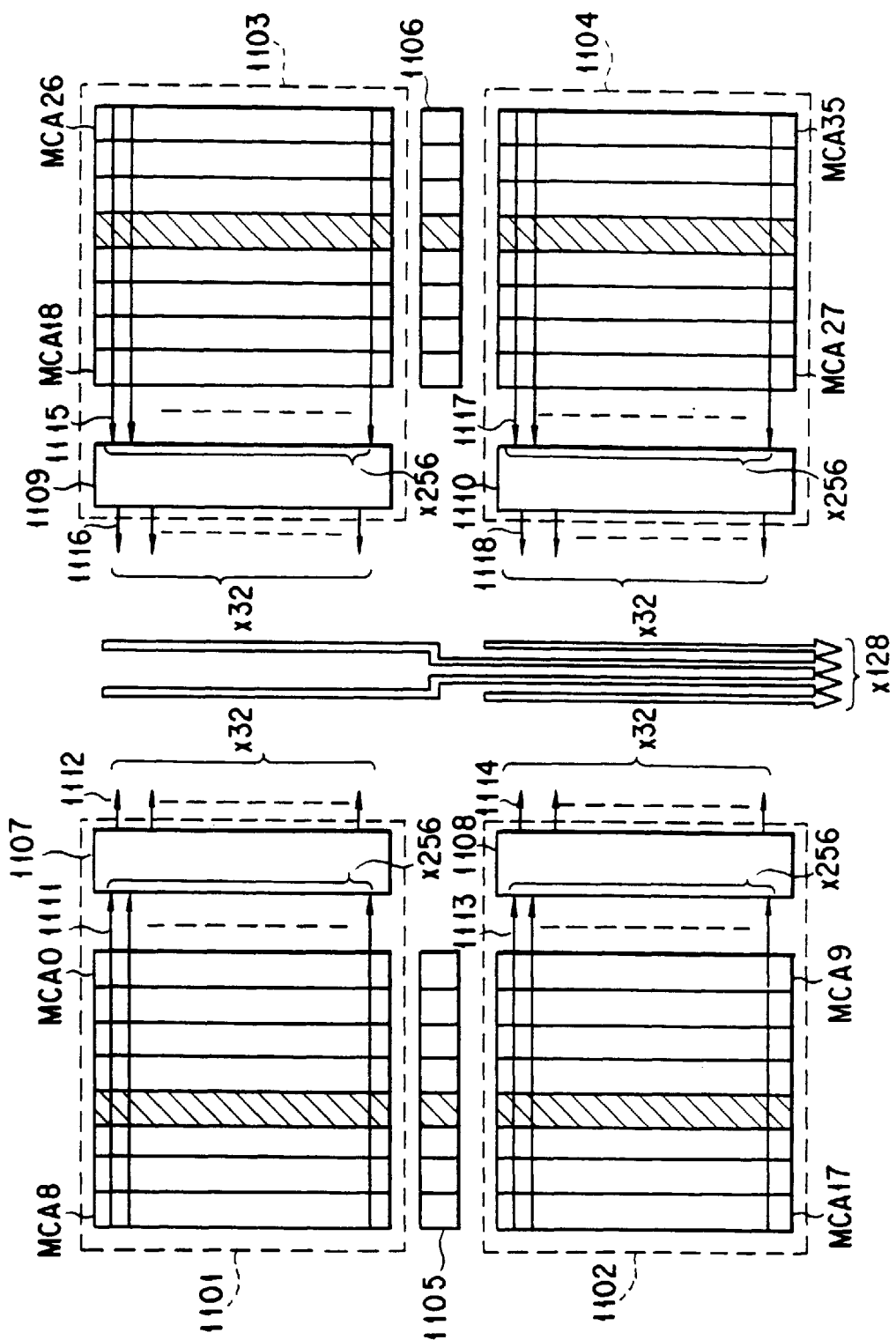
FIG. 11 illustrates a configuration of a memory system according to a fifth embodiment of the present invention.

FIG. 11 shows a structure of a memory system having 128 I/O and a memory capacity of 9 megabit as a fifth embodiment of the present invention. This memory system is formed by four blocks 1101 through 1104 which are each formed by nine memory cell arrays MCA0 through MCA8, MCA9 through MCA17, MCA18 through MCA26, and MCA27 through MCA35, respectively, having different bank addresses. Each of the memory cell arrays has 256 rows and 1024 columns, which means that the total capacity of the memory system is 9 megabit.

In the four blocks 1101, 1102, 1103, and 1104, there are groups of data lines 1111, 1113, 1115, and 1117 each consisting of 256 data lines which can be connected to the memory cell arrays MCA0 through MCA8, MCA9 through MCA17, MCA18 through MCA26, and MCA27 through MCA35, respectively, in the direction of the bit lines of the memory cell arrays. The groups of data lines 1111, 1113, 1115, and 1117 are connected to column decoders 1107, 1108, 1109, and 1110. Further, upper and lower memory cell arrays respectively include array control portions 1105 and 1106 to which a common array control signal is supplied. Memory cell arrays in positional correspondence between laterally adjoining blocks have the same bank address.

Since the array control portions 1105 basically operate similarly to the array control portions in the above-described first embodiment, this fifth embodiment also allows memory cell arrays in laterally aligned blocks which are not adjacent to each other to be sequentially activated. Further, an activated state can be maintained. It is therefore possible as in the first embodiment to reduce the number of activating and precharging operations during reading from different memory cell arrays.

FIG. 12 shows a structure of a memory system having 64 I/O and a memory capacity of 8 megabit as a sixth embodiment of the present invention. This memory system is formed by four blocks 1201 through 1204 which are each formed by eight memory cell arrays MCA0 through MCA7, MCA8 through MCA15, MCA16 through MCA23, and MCA24 through MCA31, respectively, having different bank addresses. Each of the memory cell arrays has 256 rows and 1024 columns, which means that the total capacity of the memory system is 8 megabit. 1205 and 1206 designate array control portions.

Two blocks 1201 and 1202 and two blocks 1203 and 1204 share data buses BAS1 and BAS2 having a data width of 32 I/O, respectively. Therefore, there is a data bus of 64 I/O as a whole. For example, let us assume that a bank consisting of MCA1, MCA3, MCA5, and MCA7 and a bank consisting of MCA17, MCA 19, MCA21, and MCA23 are activated when data of 32 I/O are taken out from each of the blocks 1201 and 1203. Then, memory cell arrays MCA9, MCA11, MCA13, MCA15, MCA25, MCA27, MCA29, and MCA31 are also activated simultaneously. However, the columns switches of the blocks 1202 and 1204 are all turned off, and no data transfer takes place. Conversely, when data are taken out from the blocks 1202 and 1204, all of the column switches of the blocks 1201 and 1203 are turned off. The block from which data are to be transmitted is determined depending on the column address. That is, the memory cell arrays corresponding to the blocks 1201 and 1202 and the blocks 1203 and 1204 have bank addresses which are different from each other in one high order bit. Further, all bits of the bank addresses excluding the one high order bit are input to an array selection decoder 201, and all bits of the bank addresses are input to a column selection control portion 205.

For example, if the memory cell arrays MCA1, MCA3, MCA5, MCA7, MCA17, MCA 19, MCA21, MCA23, MCA9, MCA11, MCA13, MCA15, MCA25, MCA27, MCA29, and MCA31 shaded in FIG. 12 are activated simultaneously, this means that one half of the entire memory cell arrays are activated simultaneously. Therefore, the address configuration per one I/O of this memory system is 256×2=512 rows, and 32×4×2=256 columns because the memory cell arrays on the upper and lower blocks which are simultaneously activated correspond to one bit of the column address. The number of bits required for each address is nine for the row address and eight for the column address, which result in a difference of one bit. Thus, the difference between the row and column address configurations can be small.

Figure 13:
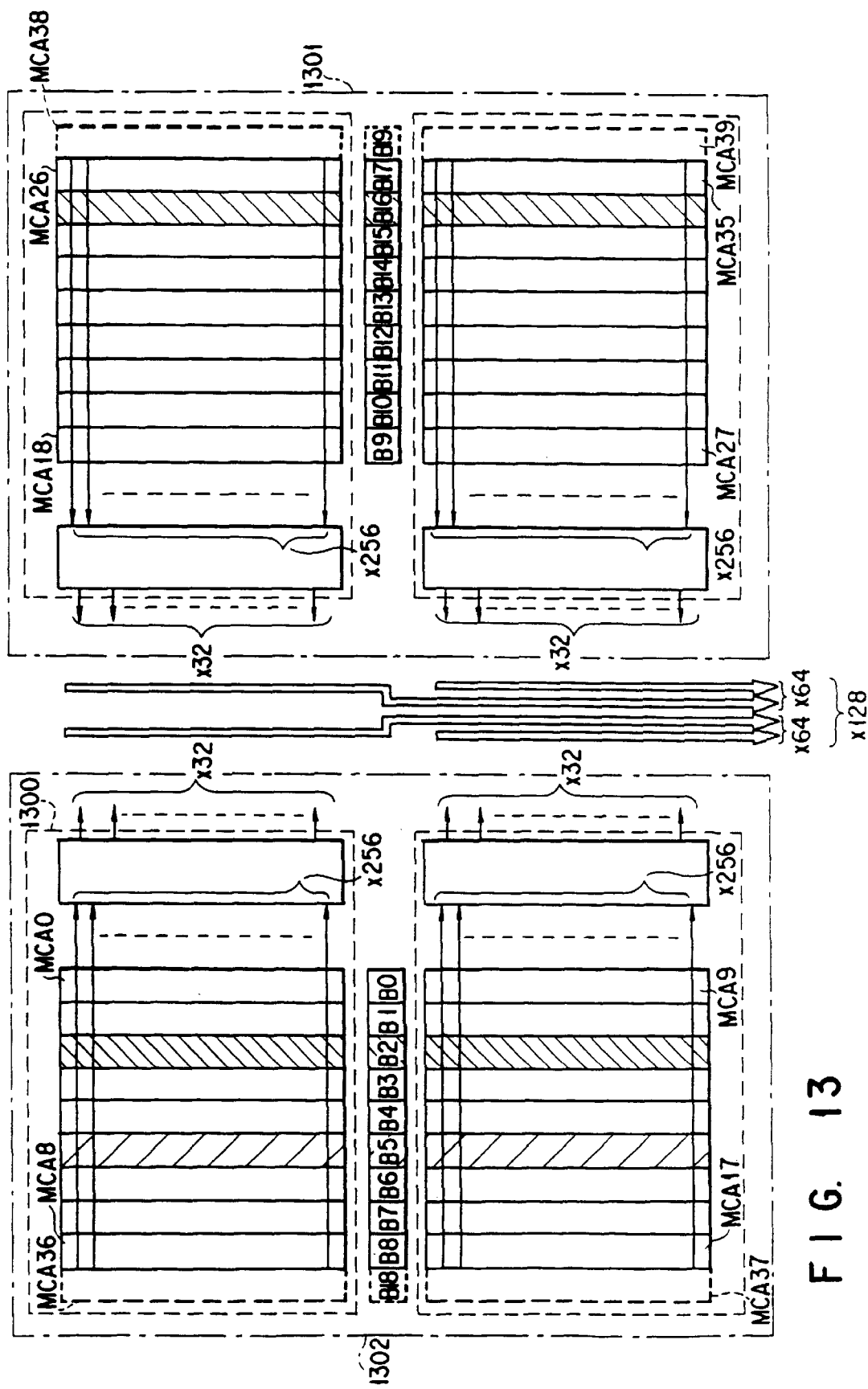
FIG. 13 illustrates a configuration of a memory system according to a seventh embodiment of the present invention.

FIG. 13 illustrates a configuration of a memory system in which memory cell arrays are operated asynchronously as a seventh embodiment of the present invention. Hereinafter, a combination of a plurality of memory cell arrays is referred to as "bank". For example, memory cell arrays MCA0 and MCA9 forms a bank B0, and eighteen banks, i.e., B1 through B17 are formed in total similarly. Those banks have different bank addresses. The configuration inside the dotted line 1300 is substantially the same as that shown in FIG. 11.

For example, let us assume that the banks B2, B5, and B16 are activated asynchronously. This is because the memory cell arrays which have been activated by array control portions are kept in an activated state until precharged. In a block 1301, since one bank B16 has been activated, data of 64 I/O are transferred from this bank B16. This bank has a configuration of 64 I/O×256 rows×32 columns. Meanwhile, in a block 1302, since two banks B2 and B5 have been activated, data of 64 I/O are transferred from either of the two banks B2 and B5. The bank to transmit data is determined by the specification of the bank at the time of the access to the data. Even if a plurality of banks have been activated in one block, data are transferred from only one bank at one access. As described above, data of 64 I/O are transferred from each of the blocks 1301 and 1302, i.e., data of 128 I/O are transferred in total. At this time, among the array control signals supplied to array control portions of the memory cell arrays in the blocks 1301 and 1302, only the signal for indicating timing is shared by the blocks, and the address signal is different between the blocks 1301 and 1302.

A description will now be made on a case wherein a bank B18 consisting of memory cell arrays MCA36 and MCA37 and a bank B19 consisting of memory cell arrays MCA 38 and MCA39 are respectively added to the blocks 1302 and 1301 to expand the memory capacity. According to the present invention, each bank has a bank address, and one bank specified by a bank address transmits data even if a plurality of banks have been activated in one block. Therefore, the memory capacity can be expanded on a bank-by-bank-basis.

Figure 14:
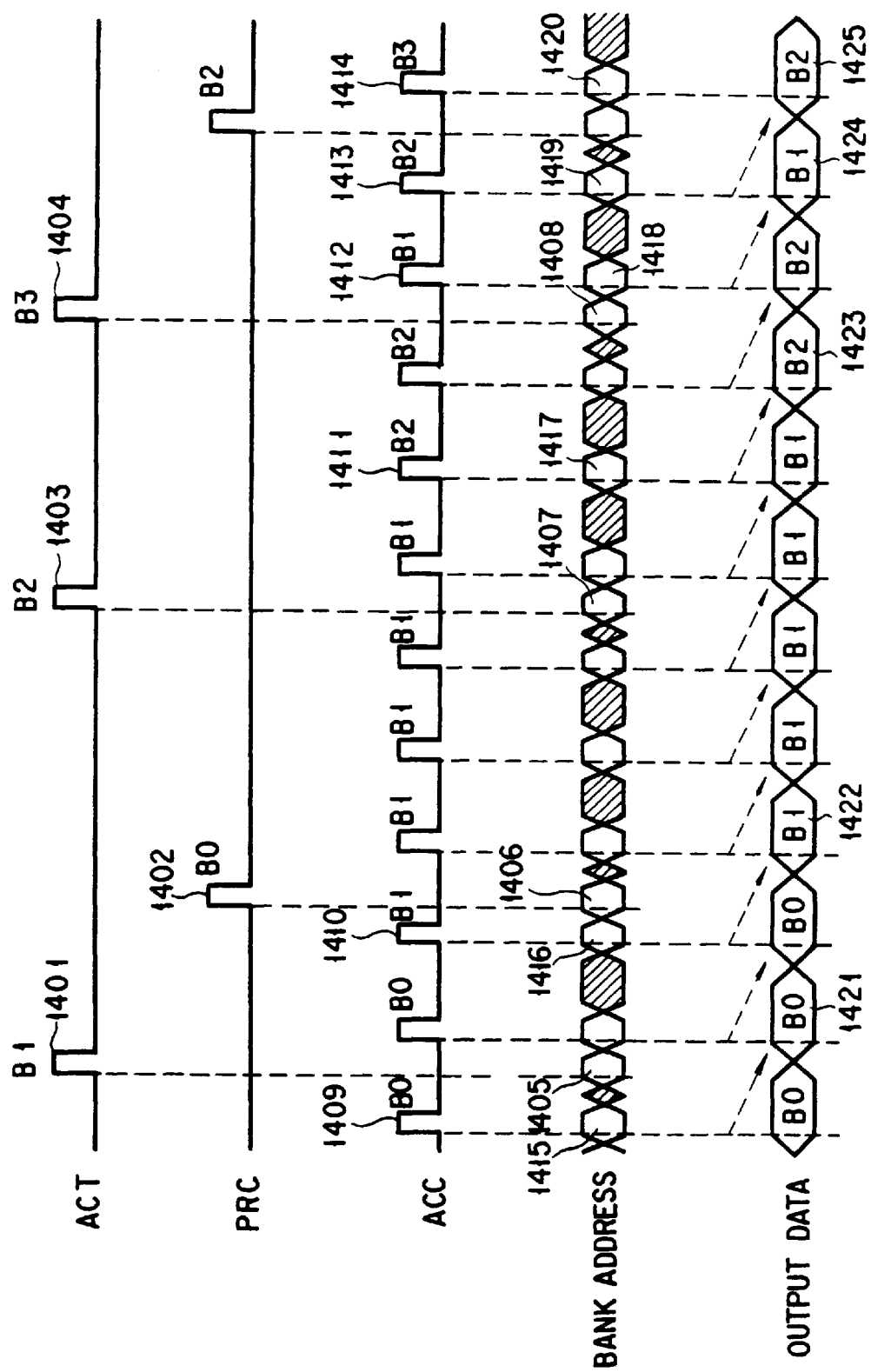
FIG. 14 illustrates an example of timing at which a memory system according to the present invention is operated asynchronously.

FIG. 14 shows relationship between various signals for bank access for the memory system described in the seventh embodiment. FIG. 14 shows the relationship between the signal ACT for activating a memory cell array, the signal PRC for precharging an array, and the signal ACC for determining timing for controlling a column switch as described above and a bank address, a column address, and output data transmitted. The letters B0, B1, B2, and B3 on the timing chart indicate that those signals are transmitted to designate respective banks. A signal ACT 1401 for activating the bank B1 is transmitted with the bank B0 activated, and the bank B1 designated by a bank address 1405 is also activated. Next, a signal PRC1402 for precharging the bank B0 is transmitted, and the bank B0 designated by the bank address 1406 is put in a precharge state. Further, a signal ACT1403 for activating the bank B2 is transmitted, and the bank B2 designated by a bank address 1407 is activated. Subsequently, a signal ACT1404 for activating the bank B3 is transmitted, and the bank B3 designated by a bank address 1408 is activated. An example of data access in such cases is shown below.

The shaded areas of the bank addresses indicate periods in which the addresses are invalid. When a predetermined period has passed after assertion of the signal ACC, data at the specified column address are output from the specified bank. For example, when a signal ACC1409 for activating the column switch of the bank B0 is transmitted with the bank B0 activated, the column switch specified by the column address of the bank B0 specified by a bank address 1415 is controlled to transmit output data 1421 at a predetermined time interval. Next, when a signal ACC1410 for controlling the column switch of the bank B1 is transmitted, since the bank B1 has already been activated, the column switch specified by the column address of the bank B1 specified by a bank address 1416 is controlled to transmit output data 1422 at a predetermined time interval. Next, when a signal ACC1411 for controlling the column switch of the bank B2 is transmitted, since the bank B2 has already been activated, the column switch specified by the column address of the bank B2 specified by a bank address 1417 is controlled to transmit output data 1423 at a predetermined time interval. When a signal ACC1412 for controlling the column switch of the bank B1 again is transmitted, since the bank B1 has been kept in an activated state and has not been precharged, the column switch specified by the column address of the bank B1 specified by a bank address 1418 is controlled to transmit output data 1424 at a predetermined time interval. When a signal ACC1413 for controlling the column switch of the bank B2 is transmitted again, since the bank B2 has been kept in an activated state and has not been precharged, again, output data 1425 are transmitted at a predetermined time interval. In this example, if there is limitation on activation of arrays between the banks by the shared sense system, either the bank B1 or B2 does not output data when those banks are formed by, for example, adjoining arrays because they are not activated simultaneously.

While several memory cell arrays remain in an activated state simultaneously as described above, the following procedure is performed each time data in different memory cell arrays are accessed, selecting each of the memory cell arrays; determining whether the cell array can be activated, and selecting the memory cell array depending on the result of the determination. This makes it possible to perform data access only by controlling the turning on/off of column switches, thereby allowing the operating time to be shortened. Further, by synchronizing the signal ACC for controlling column switches with, for example, the clock of a CPU, exchange of data between a memory system and a logic circuit in a memory combined with logic can be simplified.

A bank may be formed by any number of memory cell arrays. FIG. 15 shows a case wherein a bank is formed by four memory cell arrays. This memory system has a total memory capacity of 8 megabit and is formed by 32 cell arrays of 256 K. The system is formed by eight banks as a whole and memory cell arrays are allocated to banks B1 through B8. The allocation of the memory cell arrays to the banks is limited by the fact that adjacent memory cell arrays can not be allocated to the same bank because a sense amplifier is shared by adjacent memory cell arrays on both sides thereof. Otherwise, allocation patterns can be freely chosen. In this case, as in the seventh embodiment, a common timing signal and different address signals are supplied to blocks 1501 and 1502. In the block 1502, the bank B8 is activated, and data of 64 I/O are transferred from either of two pairs of memory cell arrays in accordance with a column address. In the block 1501, the banks B1 and B3 are activated, and data of 64 I/O are transferred from a memory cell pair selected in accordance with the bank specification by a bank address and a column address. In this case, the address configuration of one bank is 64 I/O×256 rows×64 columns.

By maintaining a plurality of memory cell arrays in an activated state simultaneously as described above, the time required for data access can be shortened. In the present embodiment, it is also possible to obtain output data of 128 I/O from the left and right blocks by keeping only a timing signal for exchange of data with memory cells in synchronization between the blocks 1501 and 1502.

The number of memory cell arrays used to form one bank is determined by the desired number of column per bank. If one bank is formed by a pair of upper and lower memory cell arrays, the memory capacity of a memory system having a data width of 128 I/O can be increased and decreased on a megabit basis by adding one pair each of memory cell arrays to both of the left and right blocks. Therefore, for example, a memory system of M megabit will have M pairs of memory cell arrays at each of the blocks. Thus, the numbers of rows and columns of an address configuration achievable in this memory system can be obtained as shown below.

Number of Rows L=256×M/m

Number of Columns C=32×m where m represents the number of memory cell arrays activated simultaneously in a block which is a divisor of M (including 1 and excluding M).

The number of banks which can be configured in this memory system for each block can be obtained as shown below.

Number of Bank B=M/m where M/m is true if B is equal to or greater than 4. If B equal to or smaller than 3, no bank can be configured because adjoining cell arrays can not be activated simultaneously. Even if the number of banks is M/m, the number of banks which can be activated simultaneously is limited to M/2m or the maximum integer which does not exceed the same. If the number of memory cell arrays is increased within such restrictions, the time required for data access can be shortened.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A semiconductor device comprising:
    at least three data holding devices each having bank addresses different from each other;
    a plurality of data amplifying transfer buffers, each coupled to said data holding devices, said plurality of data amplifying transfer buffers being divided into a plurality of groups;
    a plurality of data lines provided such that each data amplifying transfer buffer in a respective group of said plurality of data amplifying transfer buffers is coupled to a same corresponding one of said plurality of data lines, the respective group including at least one data amplifying transfer buffer for each of said data holding devices; and
    a control portion provided at each of said data holding devices, said control portion transmitting the data on a predetermined output terminal of the data holding device associated therewith to a corresponding data amplifying transfer buffer based on a control signal, transmitting predetermined data in said corresponding data amplifying transfer buffer to said corresponding one of data lines thereafter, and presetting said data amplifying transfer buffer thereafter.

2. A device according to claim 1, wherein said data holding device performs control such that the data are held in said data amplifying transfer buffer during a period after the data on the predetermined output terminal of said data holding device associated therewith are transmitted to said data amplifying transfer buffer until said data amplifying transfer buffer is preset.

3. A device according to claim 2, wherein said control signal includes a bank address, a row address, and a column address and wherein said control portion connects an output terminal of the data holding device associated therewith to a data amplifying transfer buffer based on a part of said bank address and said row address to transmit the data in the data holding devices to said data amplifying transfer buffer and thereafter connects said data amplifying transfer buffer to said data line based on said bank address and column address to transmit the data in said data amplifying transfer buffer to said data line.

4. A device according to claim 2, wherein said control signal includes a bank address, a row address, and a column address and wherein if said bank address coincides with at least a part of the bank address of a data holding unit, said control portion connects an output terminal of the data holding device associated therewith to a data amplifying transfer buffer based on the row address to transmit the data in the data holding device to said data amplifying transfer buffer, and thereafter, if said bank address coincides with the bank address of the data holding device, connects said data amplifying transfer buffer to said data line based on the column address to transmit the data in said data amplifying transfer buffer to said data line.

5. A device according to claim 2, wherein said control signal includes a bank address, a row address, a column address, a signal indicating timing for activating a data holding device, a signal indicating timing for putting a data holding device in a preset state, and a signal indicating timing for transmitting the data in said data amplifying transfer buffer to said data line and wherein said control portion connects the output terminal of the data holding device associated therewith to said data amplifying transfer buffer to transmit the data in the data holding units to said data amplifying transfer buffer based on signals transmitted by the control portions adjacent thereto indicating that said data holding device has been activated or not, at least a part of said bank address, said row address, and said timing signal for activating a data holding device, connects said data amplifying transfer buffer to said data line to transmit the data in said data amplifying transfer buffer to said data line based on said bank address and column address and said timing signal for transmitting the data in said data amplifying transfer buffer to the data line thereafter, and puts the data holding device associated therewith in a preset state based on said bank address and said timing signal for putting a data holding device in a preset state thereafter.

6. A device according to claim 2, wherein said control signal includes a signal indicating timing for activating a data holding device, a signal indicating timing for putting a data holding device in a preset state, and a signal indicating timing for transmitting the data in said data amplifying transfer buffer to said data line and wherein said control portion connects the output terminal of the data holding device associated therewith to said data amplifying transfer buffer to transmit the data in the data holding units to said data amplifying transfer buffer based on signals transmitted by the control portions adjacent thereto indicating that said data holding device has been activated or not and said signal indicating timing for activating a data holding device, connects said data amplifying transfer buffer to said data line to transmit the data in said data amplifying transfer buffer to said data line based on said signal indicating timing for transmitting the data in said data amplifying transfer buffer to the data line thereafter, and puts the data holding device associated therewith in a preset state based on said timing signal for putting a data holding device in a preset state thereafter.

7. A device according to claim 6, wherein the signal indicating timing for transmitting the data in said data amplifying transfer buffer to said data line is synchronized with an outer clock signal.

8. A semiconductor device comprising:
at least two blocks, each of said blocks including:
at least three data holding devices having bank addresses different from each other;
a plurality of data amplifying transfer buffers, each coupled to a corresponding one of said data holding devices, said plurality of data amplifying transfer buffers being divided into a plurality of groups;
a plurality of data lines provided such that each data amplifying transfer buffer in a respective group of said plurality of data amplifying transfer buffers is coupled to a same corresponding one of said plurality of data lines, the respective group including at least one data amplifying transfer buffer for each of said data holding devices; and
a control portion provided at each of said data holding devices for controlling said data holding devices in accordance with a control signal, said control portion transmitting data in the data holding device associated therewith to a corresponding one of said data lines based on said control signal.

9. A device according to claim 8, wherein said control signal includes a timing signal indicating timing at which the data in said data amplifying transfer buffer are transmitted to said data lines, said timing signal being synchronized between all of said control portions.

10. A device according to claim 8, further comprising:
data buses shared by said blocks in a quantity smaller than the number of the data lines in each of said blocks; and
a decoder provided at each of said blocks for selecting a data line to be connected to said data bus from among said data lines.

11. A device according to claim 8, wherein said control signal is common to all of said blocks.

12. A device according to claim 11, wherein each of said blocks includes a column decoder for selecting said data lines.

13. A device according to claim 11, wherein said first block includes a column decoder for selecting said data lines.

14. A semiconductor device comprising:
at least two blocks, each of said blocks including:
at least three data holding devices having bank addresses different from each other;

a plurality of data amplifying transfer buffers, each coupled to said data holding devices, said plurality of data amplifying transfer buffers being divided into a plurality of groups;

a plurality of data lines provided such that each data amplifying transfer buffer in a respective group of said plurality of data amplifying transfer buffers is coupled to a same corresponding one of said plurality of data lines, the respective group including at least one data amplifying transfer buffer for each of said data holding devices; and a plurality of control portions, each control portion provided between said blocks for controlling data holding devices in each of said blocks in accordance with a control signal, said control portion transmitting the data in corresponding ones of the data holding devices in each of said blocks to corresponding ones of said data lines based on said control signal.

15. A device according to claim 14, wherein said control portions connect selected output terminals of said data holding devices associated therewith to said data amplifying transfer buffer to transmit the data on said output terminals to said data amplifying transfer buffer, said data amplifying transfer buffer holding said data until it is preset.

16. A device according to claim 14, further comprising:

data buses provided for each of said blocks in a quantity smaller than the number of the data lines in each of said blocks; and decoders provided at each of said blocks for selecting a data line to be connected to said data bus from among said data lines.

17. A semiconductor device comprising:

at least two blocks, each of said blocks including:

at least three data holding devices having bank addresses different from each other;

a plurality of data amplifying transfer buffers, each coupled to a corresponding one of said data holding devices, said plurality of data amplifying transfer buffers being divided into a plurality of groups;

a plurality of data lines provided such that each data amplifying transfer buffer in a respective group of said plurality of data amplifying transfer buffers is coupled to a same corresponding one of said plurality of data lines, the respective group including at least one data amplifying transfer buffer for each of said data holding devices; and a plurality of control portions provided between said blocks for controlling data holding devices in each of said blocks in accordance with a control signal, said control portion transmitting the data in respective ones of the data holding devices in one of said blocks to corresponding ones of said data lines based on said control signal.

* * * * *